US011894395B2

(12) United States Patent
Kim

(10) Patent No.: US 11,894,395 B2
(45) Date of Patent: Feb. 6, 2024

(54) DISPLAY DEVICE

(71) Applicant: Samsung Display Co., LTD., Yongin-si (KR)

(72) Inventor: Yeon Kyung Kim, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 142 days.

(21) Appl. No.: 17/539,740

(22) Filed: Dec. 1, 2021

(65) Prior Publication Data

US 2022/0208800 A1 Jun. 30, 2022

(30) Foreign Application Priority Data

Dec. 30, 2020 (KR) ........................ 10-2020-0188192

(51) Int. Cl.
*H01L 27/12* (2006.01)
*H01L 25/16* (2023.01)
*H01L 23/00* (2006.01)

(52) U.S. Cl.
CPC ........ *H01L 27/1244* (2013.01); *H01L 25/167* (2013.01); *H01L 24/24* (2013.01); *H01L 2224/245* (2013.01); *H01L 2224/24147* (2013.01)

(58) Field of Classification Search
None
See application file for complete search history.

(56) References Cited

U.S. PATENT DOCUMENTS 10,520,978 B1 * 12/2019 Li .......................... G06F 1/1683
2003/0027369 A1 * 2/2003 Yamazaki .......... H10K 50/8426 438/21
2017/0262109 A1 * 9/2017 Choi ................... H01L 27/1218

FOREIGN PATENT DOCUMENTS

KR 10-0671660 1/2007
KR 10-2086644 3/2020
KR 10-2021-0057891 5/2021

* cited by examiner

*Primary Examiner* — Bo B Jang
(74) *Attorney, Agent, or Firm* — KILE PARK REED & HOUTTEMAN PLLC

(57) ABSTRACT

A display device includes a substrate including a display area and a non-display area driving circuits disposed in the non-display area; first voltage wirings and second voltage wirings extending from the display area to the non-display area; and a first auxiliary wiring electrically connected to the first voltage wirings and a second auxiliary wiring electrically connected to the second voltage wirings, the first auxiliary wiring and the second auxiliary wiring being electrically connected to the driving circuit, wherein the first voltage wirings electrically connected to an odd-numbered driving circuit among the driving circuits are electrically connected to the first auxiliary wiring through a first connection wiring, and the second voltage wirings electrically connected to an even-numbered driving circuit among the driving circuits are electrically connected to the second auxiliary wiring through a second connection wiring.

20 Claims, 12 Drawing Sheets

DISPLAY DEVICE

CROSS-REFERENCE TO RELATED APPLICATION(S)

This application claims priority to and benefits of Korean Patent Application No. 10-2020-0188192 under 35 U.S.C. § 119 filed on Dec. 30, 2020, in the Korean Intellectual Property Office, the entire contents of which are incorporated herein by reference.

BACKGROUND

1. Technical Field

The disclosure relates to a display device.

2. Description of the Related Art

The importance of display devices is increasing with the development of multimedia. In response to this, various types of display devices such as organic light emitting diode (OLED) displays and liquid crystal displays (LCDs) are being used.

Devices for displaying images of display devices include display panels such as organic light emitting display panels and liquid crystal display panels. Among them, the light emitting display panel may include a light emitting element. For example, light emitting diodes (LEDs) may include OLEDs using organic materials as fluorescent materials, inorganic LEDs using inorganic materials as fluorescent materials, and the like.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

An aspect of the disclosure is to provide a display device capable of preventing a short circuit or a burnt circuit from occurring between wirings of a non-display area by securing a gap between the wirings.

It should be noted that objects of the disclosure are not limited to the above-described objects, and other objects of the disclosure will be apparent to those skilled in the art from the following descriptions.

According to an embodiment, a display device may include a substrate including a display area and a non-display area; driving circuits disposed in the non-display area; first voltage wirings and second voltage wirings extending from the display area to the non-display area; a first auxiliary wiring electrically connected to the first voltage wirings and a second auxiliary wiring electrically connected to the second voltage wirings, the first auxiliary wiring and the second auxiliary wiring being electrically connected to the driving circuits, wherein the first voltage wirings electrically connected to an odd-numbered driving circuit among the driving circuits may be electrically connected to the first auxiliary wiring through a first connection wiring, and the second voltage wirings electrically connected to an even-numbered driving circuit among the driving circuits are electrically connected to the second auxiliary wiring through a second connection wiring.

In an embodiment, the second voltage wirings electrically connected to the odd-numbered driving circuit among the driving circuits may be directly connected to the second auxiliary wiring, and the first voltage wirings electrically connected to the even-numbered driving circuit among the driving circuits may be directly connected to the first auxiliary wiring.

In an embodiment, the first voltage wirings and the second voltage wirings may be coplanar, and the first auxiliary wiring and the second auxiliary wiring may be coplanar.

In an embodiment, the first auxiliary wiring and the second auxiliary wiring may be disposed on the first voltage wirings and the second voltage wirings.

In an embodiment, the display device may further comprise a buffer layer, a first gate insulating layer, and a first interlayer insulating layer disposed on the first voltage wirings and the second voltage wirings, wherein the first auxiliary wiring and the second auxiliary wiring may be disposed on the first interlayer insulating layer.

In an embodiment, the first connection wiring and the second connection wiring may be disposed on the first auxiliary wiring and the second auxiliary wiring.

In an embodiment, the first connection wiring and the second connection wiring may be coplanar.

In an embodiment, a second interlayer insulating layer may be disposed on the first auxiliary wiring and the second auxiliary wiring, and the first connection wiring and the second connection wiring may be disposed on the second interlayer insulating layer.

In an embodiment, the second auxiliary wiring electrically connected to the odd-numbered driving circuit may surround the first auxiliary wiring, and the first connection wiring may overlap the second auxiliary wiring.

In an embodiment, the first auxiliary wiring electrically connected to the even-numbered driving circuit may surround the second auxiliary wiring, and the second connection wiring may overlap the first auxiliary wiring.

According to an embodiment, a display device may include a substrate including a display area and a non-display area; a driving circuit disposed in the non-display area; a first voltage wiring and a second voltage wiring extending from the display area to the non-display area; a first auxiliary wiring electrically connected to the first voltage wiring and a second auxiliary wiring electrically connected to the second voltage wiring, the first auxiliary wiring and the second auxiliary wiring being electrically connected to the driving circuit; a first connection wiring electrically connecting the first voltage wiring and the first auxiliary wiring; and a second connection wiring electrically connecting the second voltage wiring and the second auxiliary wiring, wherein the first connection wiring and the second connection wiring may be disposed on the first voltage wiring and the second voltage wiring, and the first auxiliary wiring and the second auxiliary wiring may be disposed on the first connection wiring and the second connection wiring.

In an embodiment, the display device may further include a buffer layer, a first gate insulating layer, and a first interlayer insulating layer disposed on the first voltage wiring and the second voltage wiring, wherein the first connection wiring and the second connection wiring may be disposed on the first interlayer insulating layer.

In an embodiment, the display device may further include a second interlayer insulating layer disposed on the first connection wiring and the second connection wiring, wherein the first auxiliary wiring and the second auxiliary wiring may be disposed on the second interlayer insulating layer.

In an embodiment, the display device may further include an initialization voltage wiring, a first data wiring, a second data wiring, and a third data wiring extending from the display area to the non-display area and electrically connected to the driving circuit.

In an embodiment, the initialization voltage wiring, the first data wiring, the second data wiring, and the third data wiring may be coplanar with the first voltage wiring and the second voltage wiring.

In an embodiment, the first auxiliary wiring and the second auxiliary wiring may overlap the initialization voltage wiring, the first data wiring, the second data wiring, and the third data wiring.

In an embodiment, the second connection wiring may overlap the first auxiliary wiring and the second auxiliary wiring, and the first connection wiring may overlap the first auxiliary wiring and may not overlap the second auxiliary wiring.

In an embodiment, the first auxiliary wiring may surround the second auxiliary wiring and may be closer to the display area than the second auxiliary wiring.

In an embodiment, the display area may include pixels, and each of the pixels may include a first electrode and a second electrode extending in a direction and spaced apart from each other; a light emitting element having ends disposed on the first electrode and the second electrode; a first contact electrode electrically connected to an end of the light emitting element; and a second contact electrode electrically connected to another end of the light emitting element.

In an embodiment, the light emitting element may include a first semiconductor layer; a second semiconductor layer disposed on the first semiconductor layer; and a light emitting layer disposed between the first semiconductor layer and the second semiconductor layer, and the light emitting layer may include an insulating film surrounding the first semiconductor layer, the second semiconductor layer, and the light emitting layer.

BRIEF DESCRIPTION OF THE DRAWINGS

The above and other aspects and features of the disclosure will become more apparent by describing embodiments thereof in detail with reference to the attached drawings, in which.

DETAILED DESCRIPTION OF THE EMBODIMENTS

Figure 1:
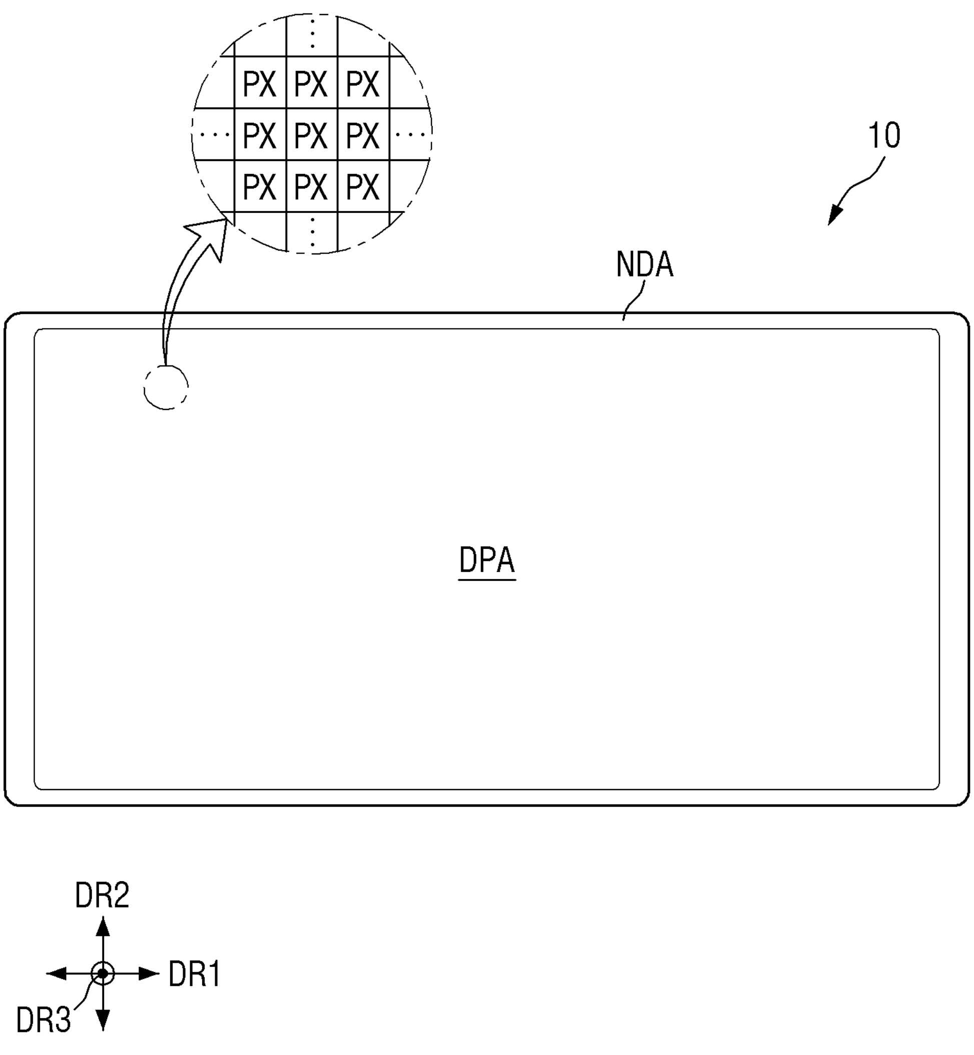
FIG. 1 is a schematic plan view of a display device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, sizes, thicknesses, ratios, and dimensions of the elements may be exaggerated for ease of description and for clarity. Like numbers refer to like elements throughout.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

It will also be understood that when a layer is referred to as being "on" another layer or substrate, it can be directly on the other layer or substrate, or intervening layers may also be present. The same reference numbers indicate the same components throughout the specification.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Each of the features of the various embodiments of the disclosure may be combined or combined with each other, in part or in whole, and other various modifications are possible. Each embodiment may be implemented independently of each other or may be implemented together.

Hereinafter, detailed embodiments will be described with reference to the accompanying drawings.

FIG. 1 is a schematic plan view of a display device according to an embodiment.

In the specification, an "upper portion," a "top," and an "upper surface" refer to an upward direction with respect to a display device 10, for example, one direction of a third direction DR3, and a "lower portion," a "bottom," and a "lower surface" refer to the other direction of the third direction DR3. Further, "left," "right," "up," and "down" refer to directions in case that the display device 10 is viewed from above. For example, "left" refers to one direction of a first direction DR1, "right" refers to the other direction of the first direction DR1, "up" refers to one direction of a second direction DR2, and "down" refers to the other direction of the second direction DR2.

Referring to FIG. 1, the display device 10 may display a moving image or a still image. The display device 10 may refer to all electronic devices providing display screens. For example, a television, a laptop computer, a monitor, a billboard, an Internet of Things (IoT) device, a mobile phone, a smart phone, a tablet personal computer (PC), an electronic watch, a smart watch, a watch phone, a head mounted display, a mobile communication terminal, an electronic notebook, an e-book reader, a portable multimedia player (PMP), a navigation device, a game console, a digital camera, a camcorder, and the like that provide display screens may be included in the display device 10.

The display device 10 may include a display panel for providing the display screen. Examples of the display panel may include an inorganic light emitting diode display panel, an organic light emitting diode (OLED) panel, a quantum dot light emitting display panel, a plasma display panel, a field emission display panel, and the like within the spirit and the scope of the disclosure. Hereinafter, a case in which the inorganic light emitting diode display panel as an example of the display panel is applied will be described, but the disclosure is not limited thereto, and the disclosure may be applied to other display panels.

The shape of the display device 10 may be variously modified. For example, the display device 10 may have a shape such as a substantially long horizontal rectangle, a substantially long vertical rectangle, substantially a square, substantially a quadrangle having substantially rounded corners (vertexes), other polygonal shapes, and substantially a circle. The shape of a display area DPA of the display device 10 may also be similar to the overall shape of the display device 10. FIG. 1 illustrates the display device 10 and the display area DPA having a substantially long horizontal rectangle shape.

The display device 10 may include the display area DPA and a non-display area NDA. The display area DPA is an area in which a screen may be displayed and the non-display area NDA is an area in which the screen is not displayed. The display area DPA may refer to an active area and the non-display area NDA may also refer to an inactive area. The display area DPA may generally occupy the center of the display device 10.

The display area DPA may include pixels PX. The pixels PX may be arranged or disposed in a matrix form. The shape of each pixel PX may be substantially a rectangle or substantially a square in the plan view, but the disclosure is not limited thereto, and the shape of each pixel PX may be a substantially rhombus shape of which each side is inclined in one direction. The pixels PX may be alternately arranged or disposed in a stripe type or a PenTile® type. Further, each of the pixels PX may include one or more light emitting elements (ED) to emit light in a wavelength band and may display a color.

The non-display area NDA may be disposed near the display area DPA. The non-display area NDA may completely or partially surround or may be adjacent to the display area DPA. The display area DPA may have a substantially rectangular shape, and the non-display area NDA may be disposed adjacent to four sides of the display area DPA. The non-display area NDA may form a bezel of the display device 10. Wirings or circuit drive units included in the display device 10 may be arranged or disposed in each non-display area NDA or external devices may be mounted in each non-display area NDA.

Figure 2:
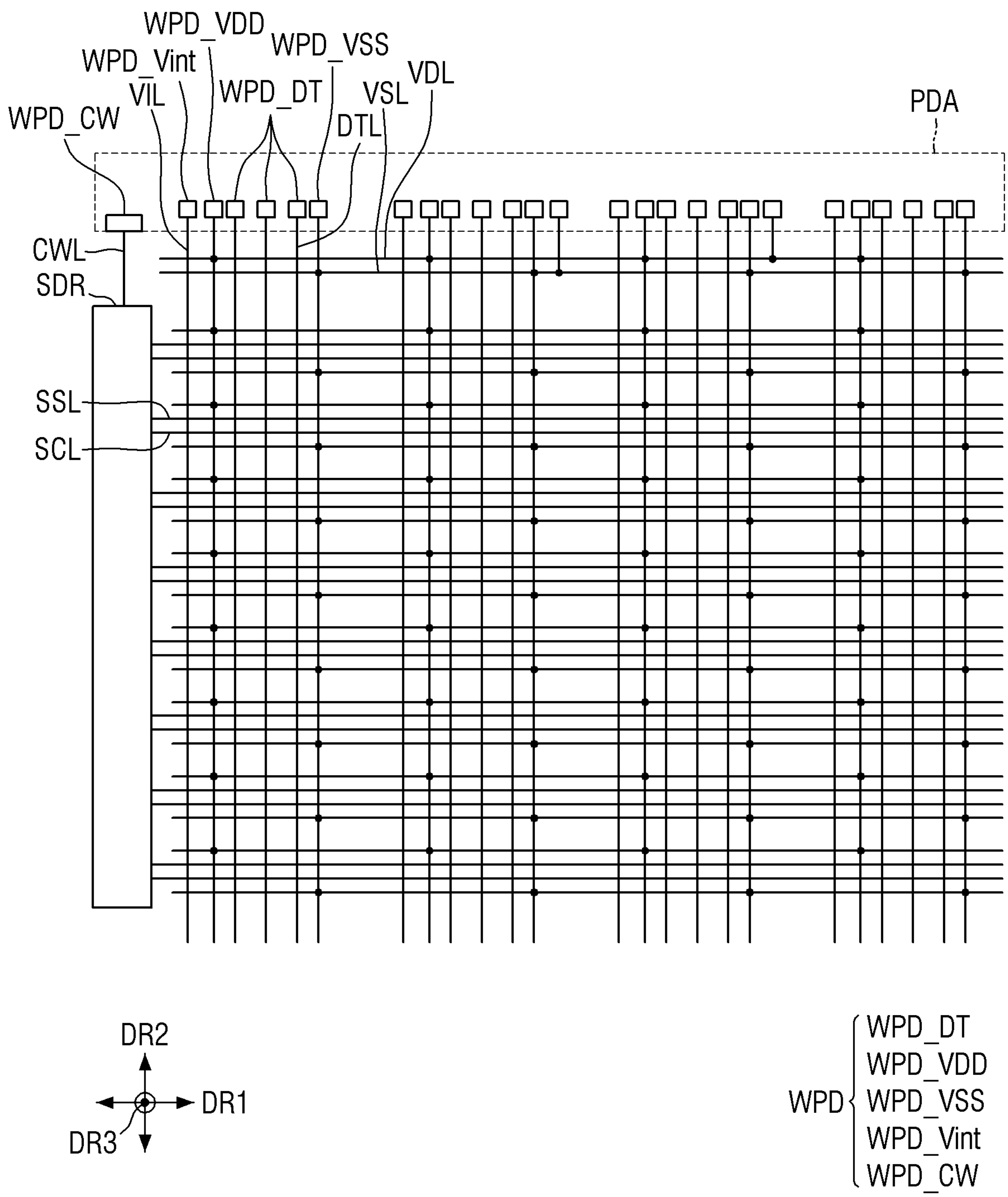
FIG. 2 is a schematic layout diagram illustrating wirings included in the display device according to an embodiment.

FIG. 2 is a schematic layout diagram illustrating wirings included in the display device according to an embodiment.

Referring to FIG. 2, the display device 10 may include wirings. The wirings may include a scan line SCL, a sensing line SSL, a data wiring DTL, an initialization voltage wiring VIL, a first voltage wiring VDL, a second voltage wiring VSL, and the like within the spirit and the scope of the disclosure. Further, although not illustrated, other wirings may be further arranged or disposed in the display device 10.

The scan line SCL and the sensing line SSL may extend in the first direction DR1. The scan line SCL and the sensing line SSL may be connected to a scan drive unit SDR. The scan drive unit SDR may include a drive circuit. Although the scan drive unit SDR may be disposed on one side or a side of the display area DPA in the first direction DR1, the disclosure is not limited thereto. The scan drive unit SDR may be connected to a signal wiring pattern CWL, and at least one end of the signal wiring pattern CWL may be connected to an external device by forming a pad WPD_CW on the non-display area NDA.

In the specification, the term "connection" may mean that a first member is connected to a second member through a third member as well as that the first member is connected to the second member through mutual physical contact. Further, it may be understood that one part and another part are connected to each other due to an integrated member. Furthermore, the connection between the first member and the second member may be interpreted as including an electrical connection through the third member in addition to a direct contact connection.

The data wiring DTL and the initialization voltage wiring VIL may extend in the second direction DR2 intersecting the first direction DR1. The first voltage wiring VDL and the second voltage wiring VSL are arranged or disposed to extend in the first direction DR1 and the second direction DR2. As will be described below, the first voltage wiring VDL and the second voltage wiring VSL are made of conductive layers in which a portion thereof extending in the first direction DR1 and a portion thereof extending in the second direction DR2 are arranged or disposed in different layers and have a mesh structure on the front surface of the display area DPA. However, the disclosure is not limited thereto. Each pixel PX of the display device 10 may be connected to at least one of the data wiring DTL, the initialization voltage wiring VIL, the first voltage wiring VDL, and the second voltage wiring VSL.

The data wiring DTL, the initialization voltage wiring VIL, the first voltage wiring VDL, and the second voltage wiring VSL may be electrically connected to at least one wiring pad WPD. Each wiring pad WPD may be disposed in the non-display area NDA. In an embodiment, a wiring pad WPD_DT (hereinafter, referred to as a "data pad") of the data wiring DTL, a wiring pad WPD_Vint (hereinafter, referred to as an "initialization voltage pad") of the initialization voltage wiring VIL, a wiring pad WPD_VDD (hereinafter, a "first power source pad") of the first voltage wiring VDL, and a wiring pad WPD_VSS (hereinafter, referred to as a "second power source pad") of the second voltage wiring VSL may be arranged or disposed in a pad area PDA on one side or a side of the display area DPA in the second direction DR2. An external device may be mounted on the wiring pad WPD. The external device may be mounted on the wiring pad WPD through an anisotropic conductive film, ultrasonic bonding, or the like within the spirit and the scope of the disclosure.

Each pixel PX or sub-pixel (PXn, n is an integer of 1 to 3) may include a pixel drive circuit. The above-described wirings may apply a drive signal to each pixel drive circuit while passing through each pixel PX or the vicinity thereof. The pixel drive circuit may include a transistor and a capacitor. The numbers of transistors and capacitors of each pixel drive circuit may be variously changed. According to an embodiment, each sub-pixel PXn of the display device 10 may have a 3T1C structure in which the pixel drive circuit may include three transistors and one capacitor. Hereinafter, the pixel drive circuit will be described with an example of the 3T1C structure, but the disclosure is not limited thereto, and various other modified pixel structures such as a 2T1C structure, a 7T1C structure, and a 6T1C structure may be applied.

Figure 3:
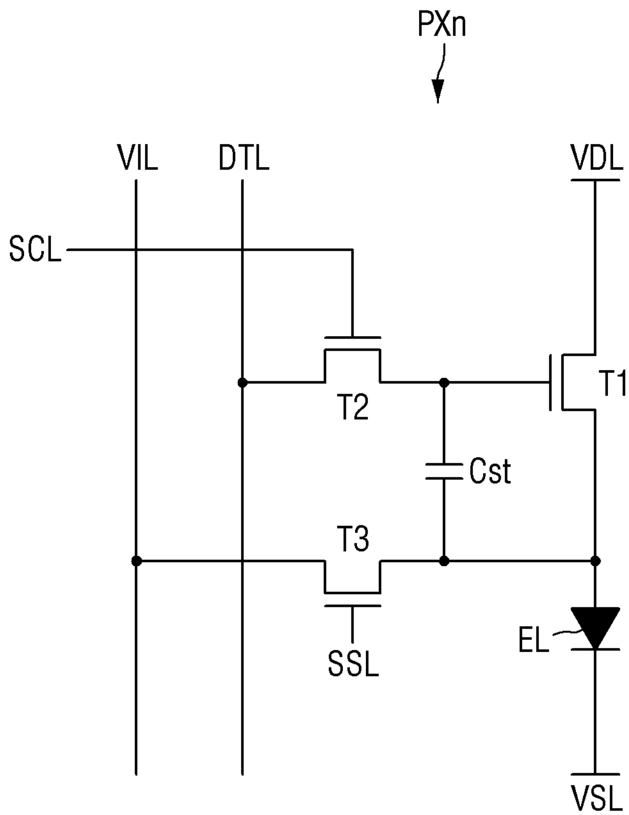
FIG. 3 is a schematic diagram of an equivalent circuit of one sub-pixel according to an embodiment.

FIG. 3 is a schematic diagram of an equivalent circuit of one sub-pixel according to an embodiment.

Referring to FIG. 3, each sub-pixel PXn of the display device 10 according to an embodiment may include three transistors T1, T2, and T3 and one storage capacitor Cst in addition to a light emitting diode EL.

The light emitting diode EL emits light according to a current supplied through the first transistor T1. The light emitting diode EL may include a first electrode, a second electrode, and at least one light emitting element disposed therebetween. The light emitting element may emit light in a wavelength band by an electrical signal transmitted from the first electrode and the second electrode.

One end of the light emitting diode EL may be connected to a source electrode of the first transistor T1, and the other end thereof may be connected to the second voltage wiring VSL to which a low potential voltage (hereinafter, referred to as a second power voltage) lower than a high potential voltage (hereinafter, referred to as a first power voltage) of the first voltage wiring VDL is supplied. Further, the other end of the light emitting diode EL may be connected to a source electrode of the second transistor T2.

The first transistor T1 adjusts a current flowing from the first voltage wiring VDL, to which the first power voltage is supplied, to the light emitting diode EL according to a voltage difference between a gate electrode and the source electrode. As an example, the first transistor T1 may be a drive transistor for driving the light emitting diode EL. The gate electrode of the first transistor T1 may be connected to the source electrode of the second transistor T2, the source electrode thereof may be connected to the first electrode of the light emitting diode EL, and a drain electrode thereof may be connected to the first voltage wiring VDL to which the first power voltage is applied.

The second transistor T2 is turned on by a scan signal of the scan line SCL to connect the data wiring DTL to the gate electrode of the first transistor T1. A gate electrode of the second transistor T2 may be connected to the scan line SCL, the source electrode thereof may be connected to the gate electrode of the first transistor T1, and a drain electrode thereof may be connected to the data wiring DTL.

The third transistor T3 is turned on by a sensing signal of the sensing line SSL to connect the initialization voltage wiring VIL to one end of the light emitting diode EL. A gate electrode of the third transistor T3 may be connected to the sensing line SSL, a drain electrode thereof may be connected to the initialization voltage wiring VIL, and a source electrode thereof may be connected to one end of the light emitting diode EL or the source electrode of the first transistor T1.

In an embodiment, the source electrode and the drain electrode of each of the transistors T1, T2, and T3 are not limited to the above description, and the opposite could be the case. Further, each of the transistors T1, T2, and T3 may be formed as a thin film transistor. Further, in FIG. 3, the description is made based on the fact that each of the transistors T1, T2, and T3 is formed as an N-type metal oxide semiconductor field effect transistor (MOSFET), but the disclosure is not limited thereto. For example, each of the transistors T1, T2, and T3 may be formed as a P-type MOSFET, or some or a number of thereof may be formed as an N-type MOSFET and the remaining transistors may be formed as a P-type MOSFET.

The storage capacitor Cst is formed between the gate electrode and the source electrode of the first transistor T1. The storage capacitor Cst stores a voltage difference between a gate voltage and a source voltage of the first transistor T1.

Hereinafter, a structure of one pixel PX of the display device 10 according to an embodiment will be described in detail with further reference to other drawings.

Figure 4:
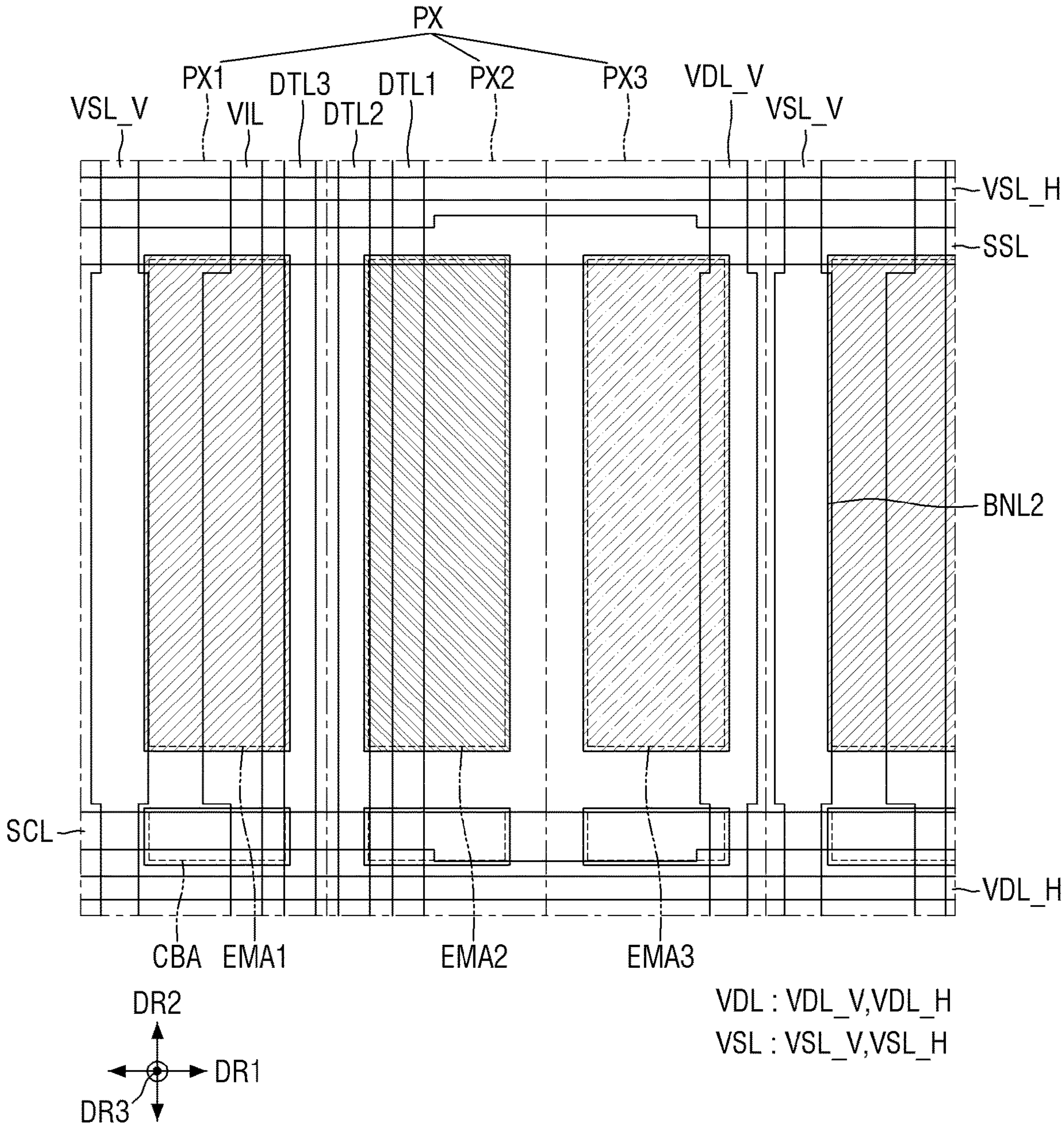
FIG. 4 is a schematic plan view illustrating wirings disclosed in one pixel of the display device according to an embodiment.

FIG. 4 is a schematic plan view illustrating wirings arranged or disposed in one pixel of the display device according to an embodiment. In FIG. 4, schematic shapes of wirings arranged or disposed in each pixel PX of the display device 10 and a second bank BNL2 are illustrated, and members arranged or disposed in light emitting areas EMA1, EMA2, and EMA3 and some or a number of conductive layers arranged or disposed therebelow are omitted. In the following drawings, both sides of the first direction DR1 may be referred to as left and right sides, and both sides of the second direction DR2 may be referred to as upper and lower sides. Further, in FIG. 4, one pixel PX and a partial area of another pixel PX adjacent thereto in the first direction DR1 are illustrated together.

Referring to FIG. 4, each of the pixels PX of the display device 10 may include sub pixels PXn (n is an integer of 1 to 3). For example, one pixel PX may include a first sub-pixel PX1, a second sub-pixel PX2, and a third sub-pixel PX3.

One pixel PX of the display device 10 may include the light emitting areas EMA1, EMA2, and EMA3, and each sub-pixel PXn may include the light emitting areas EMA1, EMA2, and EMA3 and a non-light emitting area (not illustrated). The light emitting areas EMA1, EMA2, and EMA3 may be areas in which a light emitting element ED (see FIG. 13) is disposed to emit light in a wavelength band, and the non-light emitting area may be an area in which the light emitting element ED is not disposed, the light emitted from the light emitting element ED does not reach the area, and thus the light is not emitted. The light emitting area may include an area in which the light emitting element ED is disposed and may include an area which is adjacent to the light emitting element ED and through which the light emitted from the light emitting element ED is emitted.

The disclosure is not limited thereto, and the light emitting area may include an area in which the light emitted from the light emitting element ED is reflected or refracted by another member and is emitted. The light emitting elements ED may be arranged or disposed in each sub-pixel PXn, and the light emitting area including an area in which the light emitting elements ED are arranged or disposed and an area adjacent thereto may be formed.

The first light emitting area EMA1 of the pixel PX is disposed in the first sub-pixel PX1, the second light emitting area EMA2 is disposed in the second sub-pixel PX2, and the third light emitting area EMA3 is disposed in the third sub-pixel PX3. Each sub-pixel PXn may include different types of light emitting elements ED, and light having different colors may be emitted from the first to third light emitting areas EMA1, EMA2, and EMA3. For example, the first sub-pixel PX1 may emit light having a first color, the second sub-pixel PX2 may emit light having a second color, and the third sub-pixel PX3 may emit light having a third color. The first color may be blue, the second color may be green, and the third color may be red. However, the disclosure is not limited thereto, and each sub-pixel PXn may include the same light emitting element ED, and each light emitting area EMA1, EMA2, and EMA3 or one pixel PX may emit light having the same color.

Further, the pixel PX may include cut areas CBA spaced apart from the light emitting areas EMA1, EMA2, and EMA3. The cut areas CBA may be disposed on sides of the light emitting areas EMA1, EMA2, and EMA3 of each sub-pixel PXn in the second direction DR2 and may be disposed between the light emitting areas EMA1, EMA2, and EMA3 of the adjacent sub-pixels PXn in the second direction DR2. The light emitting areas EMA1, EMA2, and EMA3 and the cut areas CBA may be repeatedly arranged or disposed in the first direction DR1, and the light emitting areas EMA1, EMA2, and EMA3 and the cut areas CBA may be alternately arranged or disposed in the second direction DR2. The light emitting element ED is not disposed in the cut areas CBA, and thus light is not emitted. However, some or a number of electrodes ("RME1" and "RME2") arranged or disposed in each sub pixel PXn may be arranged or disposed in the cut areas CBA. Some or a number of the electrodes RME1 and RME2 arranged or disposed in each sub-pixel PXn may be arranged or disposed to be separated from the cut areas CBA.

The second bank BNL2 may include a portion extending in the first direction DR1 and the second direction DR2 and may be disposed on the front surface of the display area DPA in a grid pattern when viewed from above. The second bank BNL2 may be disposed across a boundary between the sub-pixels PXn and thus a user may distinguish neighboring sub-pixels PXn. Further, the second bank BNL2 may be disposed to surround the light emitting areas EMA1, EMA2, and EMA3 and the cut areas CBA arranged or disposed in each sub-pixel PXn, and thus the user may distinguish these areas.

The above-described wirings may be arranged or disposed in each pixel PX of the display device 10. For example, the display device 10 may include horizontal wiring parts VDL_H and VSL_H of the first voltage wiring VDL and the second voltage wiring VSL in addition to the scan line SCL and the sensing line SSL arranged or disposed to extend in the first direction DR1. Further, the display device 10 may include vertical wiring parts VDL_V and VSL_V of the voltage wirings VDL and VSL in addition to the data wirings DTL and the initialization voltage wiring VIL arranged or disposed to extend in the second direction DR2.

Wirings and circuit elements of a circuit layer disposed in each pixel PX and connected to the light emitting diode EL may be connected to the first to third sub-pixels PX1, PX2, and PX3. However, the wirings and the circuit elements may not be arranged or disposed to correspond to an area occupied by each sub-pixel PXn, but may be arranged or disposed inside one pixel PX regardless of the positions of the sub-pixels PXn. For example, in the display device 10 according to an embodiment, circuit layers for driving the light emitting diode EL of each sub-pixel PXn may be arranged or disposed inside of the pixel PX regardless of the positions of the sub-pixels PXn.

One pixel PX may include the first to third sub-pixels PX1, PX2, and PX3, the circuit layers connected thereto may be arranged or disposed in patterns, and the patterns may be repeatedly arranged or disposed in units of, not the sub-pixel PXn, but one pixel PX. The sub-pixels PXn arranged or disposed in one pixel PX may be areas divided based on the light emitting areas EMA1, EMA2, and EMA3, and the circuit layers connected thereto may be arranged or disposed regardless of the areas of the sub-pixels PXn. In the display device 10, by repeatedly arranging the wirings and the elements of the circuit layer based on the unit pixel PX, the area occupied by the wirings and the elements connected to each sub-pixel PXn can be minimized, a larger number of pixels PX and sub-pixels PXn may be included per unit area, and thus an ultra-high resolution display device can be implemented.

Data wirings DTL1, DTL2, and DTL3 extend in the second direction DR2 and are arranged or disposed across the pixels PXn arranged or disposed in the second direction DR2. In the display area DPA, the data wirings DTL1, DTL2, and DTL3 may be arranged or disposed in the pixels PX arranged or disposed in the second direction DR2 and may be spaced apart from each other in the first direction DR1. The first to third data wirings DTL1, DTL2, and DTL3 may be arranged or disposed in one pixel PX and may be connected to the sub-pixels, for example, the first to third sub-pixels PX1, PX2, and PX3. The first data wiring DTL1, the second data wiring DTL2, and the third data wiring DTL3 may be sequentially arranged or disposed in the first direction DR1. As an example, although the first sub-pixel PX1, the second sub-pixel PX2, and the third sub-pixel PX3 may be sequentially arranged or disposed in one side or a side of the first direction DR1, the first data wiring DTL1, the second data wiring DTL2, and the third data wiring DTL3 may be sequentially arranged or disposed in the other side or another side of the first direction DR1. The respective data wirings DTL1, DTL2, and DTL3 may be electrically connected to the second transistor T2 through a conductive pattern disposed in another conductive layer to apply a data signal to the second transistor T2. However, as described above, the first to third data wirings DTL1, DTL2, and DTL3 are not arranged or disposed to correspond to areas occupied by the first to third sub-pixels PX1, PX2, and PX3, respectively, and may be arranged or disposed at positions inside one pixel PX. Although it is illustrated in the drawing that the first to third data wirings DTL1, DTL2, and DTL3 are arranged or disposed across the first sub-pixel PX1 and the second sub-pixel PX2, the disclosure is not limited thereto.

The initialization voltage wiring VIL extends in the second direction DR2 and is disposed across the pixels PX arranged or disposed in the second direction DR2. The initialization voltage wirings VIL may be arranged or disposed in the display area DPA to be spaced apart from each other in the first direction DR1, and each initialization voltage wiring VIL may be disposed across the pixels PX arranged or disposed in the same column. The initialization voltage wiring VIL may be disposed on the left side of the first data wiring DTL1 in the plan view. One initialization voltage wiring VIL may be disposed for one pixel PX disposed in the first direction DR1 and may be connected to a conductive pattern disposed in another conductive layer to be connected to the sub-pixel PXn. The initialization voltage wiring VIL may be electrically connected to the drain electrode of the third transistor T3 and may apply an initialization voltage to the third transistor T3.

The first voltage wiring VDL and the second voltage wiring VSL may be arranged or disposed to extend in the first direction DR1 and the second direction DR2. In an embodiment, the first voltage wiring VDL and the second voltage wiring VSL may include the vertical wiring parts VDL_V and VSL_V arranged or disposed to extend in the second direction DR2, respectively. The vertical wiring parts VDL_V and VSL_V extend in the second direction DR2 and are arranged or disposed across the pixels PX neighboring in the second direction DR2. The first vertical wiring part VDL_V of the first voltage wiring VDL may be disposed on the right side that is one side or a side of the first direction DR1 with respect to the center of each pixel PX, and the second vertical wiring part VSL_V of the second voltage wiring VSL may be disposed on the left side that is the other side or another side of the first direction DR1. The vertical wiring parts VDL_V and VSL_V may intersect the horizontal wiring parts VDL_H and VSL_H, which will be described below, and the vertical wiring parts VDL_V and VSL_V and the horizontal wiring parts VDL_H and VSL_H may be connected through a contact hole in a region in which the vertical wiring parts VDL_V and VSL_V and the horizontal wiring parts VDL_H and VSL_H intersect each other to form one voltage wiring VDL and VSL.

The data wirings DTL1, DTL2, and DTL3, the initialization voltage wiring VIL, and the vertical wiring parts VDL_V and VSL_V of the voltage wirings VDL and VSL may each be formed as a first conductive layer. The first conductive layer may further include another conductive layer in addition to the wirings and the lines.

The scan line SCL and the sensing line SSL extend in the first direction DR1 and are arranged or disposed across the pixels PX arranged or disposed in the first direction DR1. For example, the scan lines SCL and the sensing lines SSL may be spaced apart from each other in the second direction DR2, and each of the scan lines SCL and the sensing lines SSL may be disposed across the pixels PXn arranged or disposed in the same row. The scan line SCL may be disposed below the center of each pixel PX in the plan view, and the sensing line SSL may be disposed above the center of each pixel PX in the plan view. Although the scan line SCL and the sensing line SSL may be arranged or disposed in the non-light emitting area located or disposed outside the light emitting areas EMA1, EMA2, and EMA3, a portion of the sensing line SSL may be disposed across the light emitting areas EMA1, EMA2, and EMA3. Further, the scan line SCL and the sensing line SSL may be arranged or disposed on a second conductive layer disposed on the first conductive layer and may be connected to a gate pattern extending in the second direction DR2, and the gate pattern may constitute the gate electrode of the second transistor T2 or the third transistor T3.

The horizontal wiring parts VDL_H and VSL_H of the first voltage wiring VDL and the second voltage wiring VSL extend in the first direction DR1 and are arranged or disposed across the adjacent pixels PX in the first direction DR1. The horizontal wiring parts VDL_H and VSL_H may be arranged or disposed to be spaced apart from each other in the second direction DR2, and the horizontal wiring parts VDL_H and VSL_H may be arranged or disposed across the pixels PX arranged or disposed in the same row. The first horizontal wiring part VDL_H of the first voltage wiring VDL may be disposed on the lower side that is the other side or another side of the second direction DR2 with respect to the center of each pixel PX, and the second horizontal wiring part VSL_H of the second voltage wiring VSL may be disposed on the upper side that is one side or a side of the second direction DR2. The vertical wiring parts VDL_V and VSL_V and the horizontal wiring parts VDL_H and VSL_H may be formed as conductive layers arranged or disposed in different layers and may be connected through the contact hole. For example, the first horizontal wiring part VDL_H may be disposed under or below the pixel PX and may be connected through the contact hole at a portion intersecting the first vertical wiring part VDL_V but may not be connected at a portion intersecting the second vertical wiring part VSL_V. Similarly, the second horizontal wiring part VSL_H may be disposed on the pixel PX and may be connected through the contact hole at a portion intersecting the second vertical wiring part VSL_V but may not be connected at a portion intersecting the first vertical wiring part VDL_V.

In an embodiment, the first voltage wiring VDL and the second voltage wiring VSL may be arranged or disposed outside the light emitting areas EMA1, EMA2, and EMA3 and may extend in the first direction DR1 and the second direction DR2. The first voltage wiring VDL and the second voltage wiring VSL may be arranged or disposed in a mesh structure on the front surface of the display area DPA, may be arranged or disposed to surround the light emitting areas EMA1, EMA2, and EMA3, and may be electrically connected to electrode lines RM1 and RM2 arranged or disposed outside the light emitting areas EMA1, EMA2, and EMA3.

Further, the first to third sub-pixels PX1, PX2, and PX3 of each pixel PX may share the same first voltage wiring VDL and the same second voltage wiring VSL. As described above, the sub-pixels PXn arranged or disposed in each pixel PX shares the first voltage wiring VDL and the second voltage wiring VSL to which the same signal is applied, and thus the number of wirings per unit area can be reduced.

The first voltage wiring VDL may be electrically connected to the drain electrode of the first transistor T1 of each sub-pixel PXn and may apply the first power voltage to the first transistor T1. The first voltage wiring VDL may be electrically connected to a second electrode of the light emitting diode EL and may apply the second power voltage to the light emitting element.

Although it is illustrated in the drawing that one vertical wiring part VDL_V, one vertical wiring part VSL_V, one horizontal wiring part VDL_H, and one horizontal wiring part VSL_H are arranged or disposed in one pixel PX, the disclosure is not limited thereto. In the first voltage wiring VDL and the second voltage wiring VSL, the vertical wiring parts VDL_V and VSL_V are arranged or disposed to correspond to one pixel PX, and the first voltage wiring VDL and the second voltage wiring VSL may share the vertical wiring parts VDL_V and VSL_V and the horizontal wiring parts VDL_H and VSL_H with adjacent pixels PX. The vertical wiring parts VDL_V and VSL_V may not be repeatedly arranged or disposed in the first direction DR1 in units of pixels PX and may be arranged or disposed alternately with each other, and the horizontal wiring parts VDL_H and VSL_H may not be repeatedly arranged or disposed in the second direction DR2 and arranged or disposed alternately with each other. Accordingly, some or a number of the pixels PX may be arranged or disposed in a structure in which the wirings and the elements of the circuit layer connected to the light emitting diode EL are symmetrical to each other with respect to a boundary between the pixels PX. Further, the light emitting element ED, the electrodes RME1 and RME2, and the electrode lines RM1 and RM2 may also have a direction, and the pixels PX may be arranged or disposed in a structure in which the light emitting element ED and the electrodes RME1 and RME2 are symmetrical to each other. A detailed description thereof will be described below.

The scan line SCL, the sensing line SSL, and the horizontal wiring parts VDL_H and VSL_H may be formed as a third conductive layer disposed on the second conductive layer. The third conductive layer may further include other conductive patterns in addition to the wirings and the lines.

In the display device 10 according to an embodiment, the circuit layer, which transfers a signal for driving the light emitting diode EL, may include first to third conductive layers. By way of example, the first voltage wiring VDL and the second voltage wiring VSL that apply a power voltage to the light emitting diode EL may be formed as wirings arranged or disposed in the first conductive layer and the third conductive layer and may be arranged or disposed to be coplanar with the data wirings DTL, the initialization voltage wiring VIL, or other conductive patterns. The display device 10 has an advantage in a manufacturing process because the number of conductive layers constituting the circuit layer may be reduced. Hereinafter, a structure of each sub-pixel PXn will be described in more detail with further reference to other drawings.

Figure 5:
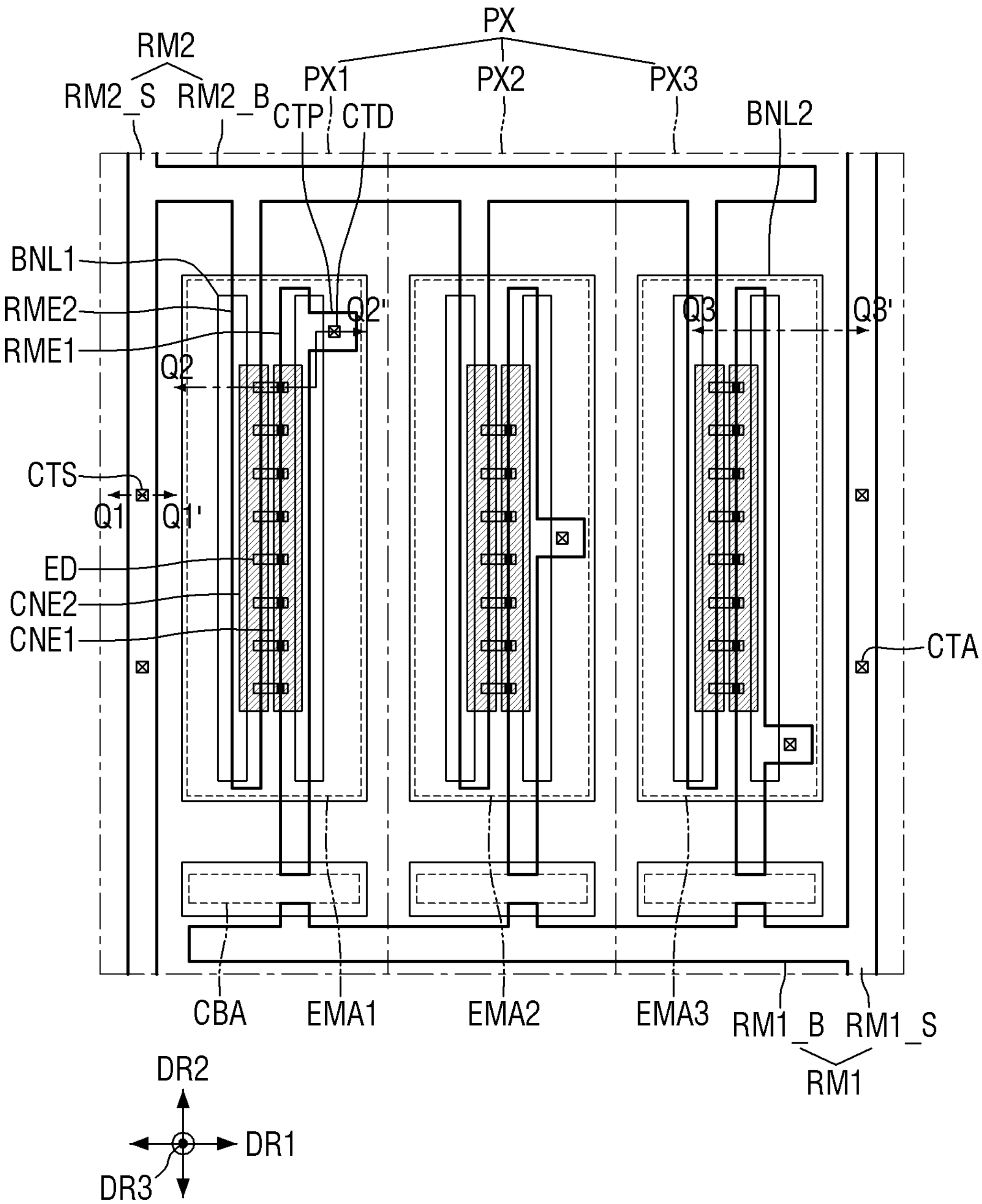
FIG. 5 is a schematic plan view illustrating electrodes and banks included in one pixel of the display device according to an embodiment.
Figure 6:
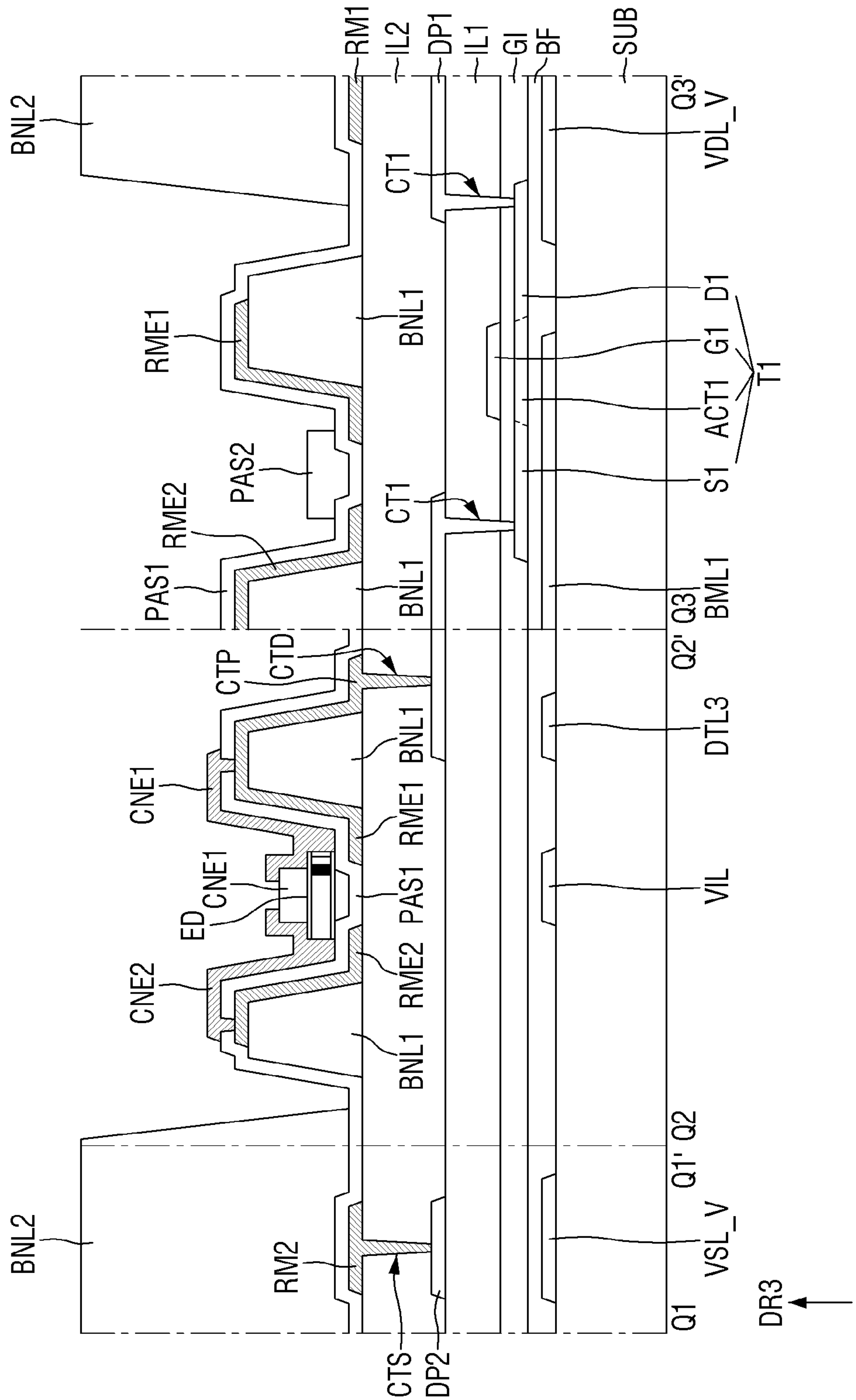
FIG. 6 is a schematic cross-sectional view taken along lines Q1-Q1', Q2-Q2', and Q3-Q3' of FIG. 5.

FIG. 5 is a schematic plan view illustrating electrodes and banks included in one pixel of the display device according to an embodiment. FIG. 6 is a schematic cross-sectional view taken along lines Q1-Q1', Q2-Q2', and Q3-Q3'.

FIG. 5 illustrates a display element layer disposed on each pixel PX on the basis of each sub-pixel PXn distinguished by the second bank BNL2. FIG. 5 illustrates an arrangement of the electrode lines RM1 and RM2, banks BNL1 and BNL2, and contact electrodes CNE1 and CNE2 in addition to the electrodes RME1 and RME2 and the light emitting elements ED constituting the light emitting diode EL. FIG. 6 illustrates a cross section of the first transistor T1.

Referring to FIGS. 5 and 6 in conjunction with FIGS. 3 and 4, the display device 10 may include the circuit layer and the display element layer. The display element layer may be a layer in which the electrode lines RM1 and RM2, the first electrode RME1, and the second electrode RME2 in addition to the light emitting element ED of the light emitting diode EL are arranged or disposed, and the circuit layer may be a layer in which wirings are arranged or disposed in addition to pixel circuit elements for driving the light emitting diode EL. For example, the circuit layer may include the respective transistors T1, T2, and T3 in addition to the scan line SCL, the sensing linen SSL, the data wiring DTL, the initialization voltage wiring VIL, the first voltage wiring VDL, and the second voltage wiring VSL.

In detail, the display device 10 may include a first substrate SUB on which the circuit layer and the display element layers are arranged or disposed. The first substrate SUB may be an insulating substrate and made of an insulating material such as glass, quartz, and a polymer resin. Further, the first substrate SUB may be a rigid substrate but may be a flexible substrate capable of bending, folding, rolling, or the like within the spirit and the scope of the disclosure.

The first conductive layer may be disposed on the first substrate SUB. The first conductive layer may include the vertical wiring parts VDL_V and VSL_V of the voltage wirings VDL and VSL, the initialization voltage wiring VIL, the data wirings DTL1, DTL2, and DTL3, and a light blocking layer BML1.

The vertical wiring parts VDL_V and VSL_V of the voltage wirings VDL and VSL may be arranged or disposed to extend in the second direction DR2. The vertical wiring parts VDL_V and VSL_V of the voltage wirings VDL and VSL are arranged or disposed at positions overlapping the second bank BNL2 in the third direction DR3 that is a thickness direction, in the non-light emitting area so as not to overlap the light emitting areas EMA1, EMA2, and EMA3. The vertical wiring parts VDL_V and VSL_V may be connected to the pads WPD_VDD and WPD_VSS, and the first power voltage and the second power voltage may be applied to the vertical wiring parts VDL_V and VSL_V.

The first vertical wiring part VDL_V of the first voltage wiring VDL may be connected to the drain electrode of the first transistor T1 through a first conductive pattern DP1 of the third conductive layer. Further, the first vertical wiring part VDL_V may be interconnected through the contact hole at a position intersecting the first horizontal wiring part VDL_H. The second vertical wiring part VSL_V of the second voltage wiring VSL may be connected to the second electrode RME2 through a second conductive pattern DP2 of the third conductive layer. Further, the second vertical wiring part VSL_V may be interconnected through the contact hole at a position intersecting the second horizontal wiring part VSL_H.

The initialization voltage wiring VIL may extend in the second direction DR2 and may be disposed between the vertical wiring parts VDL_V and VSL_V. The initialization voltage wiring VIL may be connected to the drain electrode of the third transistor T3 and may transfer an initialization voltage to the third transistor T3 of each sub-pixel PXn.

The light blocking layer BML1 may be disposed on the first substrate SUB. The light blocking layer BML1 may be disposed to overlap a first active layer ACT1 of the first transistor T1. The light blocking layer BML1 may include a light blocking material and may prevent light from being incident in the first active layer ACT1 of the first transistor T1. As an example, the light shielding layer BML1 may be made of an opaque metal material that blocks light transmission.

The data wirings DTL1, DTL2, and DTL3 are arranged or disposed to extend in the second direction DR2 between the initialization voltage wiring VIL and the light blocking layers BML1. The first data wiring DTL1 may be connected to the transistor of the first sub-pixel PX1, the second data wiring DTL2 may be connected to the transistor of the second sub-pixel PX2, and the third data wiring DTL3 may be connected to the transistor of the third sub-pixel PX3.

A buffer layer BF may be entirely disposed on the first substrate SUB including the first conductive layer. The buffer layer BF may be formed on the first substrate SUB to protect the transistors T1, T2, and T3 from moisture penetrating through the first substrate SUB vulnerable to moisture permeation, and the buffer layer BF may perform a surface flattening function.

A semiconductor layer is disposed on the buffer layer BF. The semiconductor layer may include active layers of the transistors T1, T2, and T3. One pixel PX may include first active layers ACT1 included in the first transistors T1 connected to the sub-pixels PX1, PX2, and PX3. A first drain area D1 is formed on one side or a side of the first active layer ACT1, and a first source area S1 is formed on the other side or another thereof. The first drain area D1 and the first source area S1 may be arranged or disposed to overlap the first vertical wiring part VDL_V and the light blocking layer BML1, respectively.

In an embodiment, the semiconductor layer may include polycrystalline silicon, single crystalline silicon, an oxide semiconductor, or the like within the spirit and the scope of the disclosure. The polycrystalline silicon may be formed by crystallizing amorphous silicon. In case that the semiconductor layer may include an oxide semiconductor, the first active layers ACT1 may include conductor areas and channel areas therebetween. The oxide semiconductor may be an oxide semiconductor containing indium (In). In an embodiment, the oxide semiconductor may be indium-tin oxide (ITO), indium-zinc oxide (IZO), indium-gallium oxide (IGO), indium-zinc-tin oxide (IZTO), indium-gallium-zinc oxide (IGZO), indium-gallium-tin oxide (IGTO), indium-gallium-zinc-tin oxide (IGZTO), or the like within the spirit and the scope of the disclosure.

In an embodiment, the semiconductor layer may include polycrystalline silicon. The polycrystalline silicon may be formed by crystallizing amorphous silicon. The conductor region of the first active layer ACT1 may be a doped area doped with impurities. However, the disclosure is not limited thereto.

A first gate insulating layer GI may be disposed on the semiconductor layer and the buffer layer BF. The first gate insulating layer GI may include the semiconductor layer and be disposed on the buffer layer BF. The first gate insulation layer GI may function as gate insulating films of the transistors.

The second conductive layer may be disposed on the first gate insulating layer GI. The second conductive layer may include a first capacitive electrode of a storage capacitor constituting the gate electrodes of the transistors T1, T2, and T3.

The first interlayer insulating layer IL1 may be disposed on the second conductive layer. The first interlayer insulating layer IL1 may be disposed to cover or overlap the second conductive layer and function to protect the second conductive layer.

The third conductive layer is disposed on the first interlayer insulating layer ILL The third conductive layer may include the scan line SCL, the sensing line SSL, and the horizontal wiring parts VDL_H and VSL_H. Further, the third conductive layer may include conductive patterns DP1 and DP2 connected to the source area S1 and the drain area D1 of the transistors T1, T2, and T3 or connected to the vertical wiring parts VDL_V and VSL_V or the initialization voltage wiring VIL.

The scan line SCL and the sensing line SSL extend in the first direction DR1 and are respectively arranged or disposed on the upper side and the lower side of each pixel PX. The sensing line SSL may be disposed on the pixel PX.

The first conductive pattern DP1 may be disposed on the right side of each pixel PX and have a shape extending in the second direction DR2. The first conductive pattern DP1 may be disposed to overlap the first vertical wiring part VDL_V in the thickness direction and connected to the first vertical wiring part VDL_V through the contact hole passing through the buffer layer BF, the first gate insulating layer G1, and the first interlayer insulating layer IL1. Further, the first conductive pattern DP1 may be connected to the first drain area D1 of the first transistor T1 through the contact hole passing through the first gate insulating layer GI and the first interlayer insulating layer IL1 and form the drain electrode of the first transistor T1. The first transistor T1 may be connected to the first voltage wiring VDL through the first conductive pattern DP1, and the first power voltage may be transmitted to the first transistor T1.

The second conductive pattern DP2 may be disposed on the left side of each pixel PX and have a shape extending in the second direction DR2. The second conductive pattern DP2 may be disposed to overlap the second vertical wiring part VSL_V in the thickness direction and connected to the second vertical wiring part VSL_V through the contact hole passing through the buffer layer BF, the first gate insulating layer G1, and the first interlayer insulating layer ILL Further, the second conductive pattern DP2 may be connected to the second electrode line RM2 which will be described below, and the second power voltage may be applied to the second electrode line RM2 and the second electrode RME2.

The horizontal wiring parts VDL_H and VSL_H of the voltage wirings VDL and VSL may be arranged or disposed on the lower side and the upper side of each pixel PX. The first horizontal wiring part VDL_H may be connected to the first vertical wiring part VDL_V at a portion intersecting the first vertical wiring part VDL_V through the contact hole passing through the buffer layer BF, the first gate insulating layer GI, and the first interlayer insulating layer ILL Similarly, the second horizontal wiring part VSL_H may be connected to the second vertical wiring part VSL_V at a portion intersecting the second vertical wiring part VSL_V through the contact hole passing through the buffer layer BF, the first gate insulating layer GI, and the first interlayer insulating layer IL1.

The second interlayer insulating layer IL2 is disposed on the third conductive layer. The second interlayer insulating layer IL2 may function as an insulating film between the third conductive layer and other layers arranged or disposed on the third conductive layer. Further, the second interlayer insulating layer IL2 may cover or overlap the third conductive layer and function to protect the third conductive layer. Further, the second interlayer insulating layer IL2 may perform a surface flattening function.

The above-described first to third conductive layers may be formed as a single layer or a multi-layer made of any one of molybdenum (Mo), aluminum (Al), chromium (Cr), gold (Au), titanium (Ti), nickel (Ni), neodymium (Nd), and copper (Cu) or an alloy thereof. However, the disclosure is not limited thereto.

Further, the buffer layer BF, the first gate insulating layer GI, the first interlayer insulating layer ILL and the second interlayer insulating layer IL2 described above may be made of an inorganic layer containing inorganic materials, for example, silicon oxide ($SiO_x$), silicon nitride ($SiN_x$), and silicon oxynitride ($SiO_xN_y$), or may be formed in a structure in which inorganic layers may be stacked each other.

The first banks BNL1, the electrode lines RM1 and RM2, the electrodes RME1 and RME2, the light emitting element ED, the second bank BNL2, and the contact electrodes CNE1 and CNE2 may be arranged or disposed on the second interlayer insulating layer IL2. Further, insulating layers PAS1 and PAS2 may be further arranged or disposed on the second interlayer insulating layer IL2.

The first banks BNL1 may be arranged or disposed or directly arranged or disposed on the second interlayer insulating layer IL2. One sub-pixel PXn may include the first banks BNL1 which are each arranged or disposed in one of the light emitting areas EMA1, EMA2, and EMA3 and are spaced apart from each other. For example, in one sub-pixel PXn, two first banks BNL1 are arranged or disposed in the light emitting areas EMA1, EMA2, and EMA3, and the two first banks BNL1 may be spaced apart from each other in the first direction DR1. The light emitting element ED may be disposed between the first banks BNL1 spaced apart from each other in the first direction DR1. Although it is illustrated in the drawing that the two first banks BNL1 are arranged or disposed in the light emitting areas EMA1, EMA2, and EMA3 of each sub-pixel PXn to form a linear or stripe-type pattern, the disclosure is not limited thereto. The number of first banks BNL1 arranged or disposed in the light emitting areas EMA1, EMA2, and EMA3 of each sub-pixel PXn may vary according to the number of electrodes RME1 and RME2 or the arrangement of the light emitting elements ED.

The first banks BNL1 have a length measured in the second direction DR2 that is smaller than the length of the light emitting areas EMA1, EMA2, and EMA3 measured in the second direction DR2, and thus parts of the first banks BNL1 may be arranged or disposed so as not to overlap the second bank BNL2 of the non-light emitting area.

The first bank BNL1 may have a structure in which at least a portion of the first bank BNL1 protrudes from the upper surface of the second interlayer insulating layer IL2. The protruding portion of the first bank BNL1 may have an inclined side surface, and the light emitted from the light emitting element ED may be reflected by the electrodes RME1 and RME2 arranged or disposed on the first bank BNL1 and may be emitted in the upward direction of the second interlayer insulating layer IL2. The first bank BNL1 may function as a reflective wall that provides an area in which the light emitting element ED is disposed and reflects the light emitted from the light emitting element ED in the upward direction. The side surface of the first bank BNL1 may have a substantially linear shape, but the disclosure is not limited thereto, and the first bank BNL1 may have a substantially semi-circular or substantially semi-elliptical shape of which an outer surface may be substantially curved. The first banks BNL1 may include an organic insulating material such as polyimide (PI), but the disclosure is not limited thereto.

The electrodes RME1 and RME2 have a shape extending in one direction and are arranged or disposed in each sub-pixel PXn. The electrodes RME1 and RME2 may extend in the second direction DR2, may be spaced apart from each other in the first direction DR1, and may be arranged or disposed in each sub-pixel PXn. The electrodes RME1 and RME2 may include the first electrode RME1 and the second electrode RME2, and the light emitting elements ED may be arranged or disposed on the electrodes RME1 and RME2. Although it is illustrated in the drawing that one first electrode RME1 and one second electrode RME2 are arranged or disposed, the disclosure is not limited thereto, and the positions in which the electrodes RME1 and RME2 are arranged or disposed may change according to the number of electrodes RME1 and RME2 arranged or disposed in each sub-pixel PXn or the number of light emitting elements ED arranged or disposed in each sub-pixel PXn.

The electrodes RME1 and RME2 arranged or disposed in each sub-pixel PXn may be arranged or disposed on the first banks BNL1 spaced apart from each other. The electrodes RME1 and RME2 may be arranged or disposed on sides of the first banks BNL1 in the first direction DR1 and be arranged or disposed on the inclined side surfaces of the first banks BNL1. In an embodiment, the width of the electrodes RME1 and RME2 in the first direction DR1 may be smaller than the width of the first banks BNL1 in the first direction DR1. Each of the electrodes RME1 and RME2 may be disposed to cover or overlap at least one side or a side surface of the first bank BNL1 and thus reflect the light emitted from the light emitting element ED.

Further, a distance between the electrodes RME1 and RME2 in the first direction DR1 may be smaller than a distance between the first banks BNL1. The electrodes RME1 and RME2 may have at least partial areas arranged or disposed or directly arranged or disposed on the second interlayer insulating layer IL2 and thus may be arranged or disposed to be coplanar.

The display device 10 according to an embodiment may include the extended electrode lines RM1 and RM2 arranged or disposed outside the light emitting areas EMA1, EMA2, and EMA3 and surrounding the light emitting areas EMA1, EMA2, and EMA3. The electrode lines RM1 and RM2 may include the first electrode line RM1 extending from the right side of each pixel PX in the second direction DR2 and disposed to overlap the first vertical wiring part VDL_V of the first voltage wiring VDL, and the second electrode line RM2 extending from the left side of each pixel PX in the second direction DR2 and disposed to overlap the second vertical wiring part VSL_V of the second voltage wiring VSL. The electrode lines RM1 and RM2 may be arranged or disposed to overlap a portion of the first voltage wiring VDL or the second voltage wiring VSL and connected to the portion of the first voltage wiring VDL or the second voltage wiring VSL.

Further, the first electrode line RM1 and the second electrode line RM2 may further include a part branched off in the first direction DR1. For example, the first electrode line RM1 may include a first electrode stem part RM1_S extending in the second direction DR2 and a first electrode branch part RM1_B branched off from the first electrode stem part RM1_S in the first direction DR1. The second electrode line RM2 may include a second electrode stem part RM2_S extending in the second direction DR2 and a second electrode branch part RM2_B branched off from the second electrode stem part RM2_S in the first direction DR1. The first electrode branch part RM1_B is disposed to be branched off to the other side or another side in the first direction DR1, is spaced apart from the second electrode stem part RM2_S, and overlaps the first horizontal wiring part VDL_H. The second electrode branch part RM2_B is disposed to be branched off to one side or a side in the first direction DR1, is spaced apart from the first electrode stem part RM1_S, and overlaps the second horizontal wiring part VSL_H.

In an embodiment, the electrode lines RM1 and RM2 may be utilized to generate an electric field for arranging the light emitting element ED by applying an orientation signal to the electrodes RME1 and RME2 arranged or disposed in each of the light emitting areas EMA1, EMA2, and EMA3. The first electrode line RM1 and the second electrode line RM2 include the electrode stem parts RM1_S and RM2_S and are arranged or disposed across the pixels PX. The electrode lines RM1 and RM2 may be connected to the first electrode RME1 and the second electrode RME2 of each sub-pixel PXn, and in case that the orientation signal is applied to the electrode lines RM1 and RM2, an electric field may be generated on the electrodes RME1 and RME2. In case that the light emitting elements ED are sprayed onto the electrode lines through an inkjet printing process and ink including the light emitting elements ED is sprayed onto the electrode lines, the orientation signal is applied to the electrode lines to generate an electric field. The light emitting element ED may be disposed on the electrodes by the electric field formed between the electrode lines. The light emitting element ED distributed in the ink may be arranged or disposed on the electrode RME1 and RME2 by the generated electric field.

In an embodiment in which the electrode lines RM1 and RM2 include the electrode stem parts RM1_S and RM2_S and the electrode branch parts RM1_B and RM2_B branched off from the electrode stem parts RM1_S and RM2_S, the first electrode RME1 and the second electrode RME2 may be connected to the first electrode branch part RM1_B and the second electrode branch part RM2_B, respectively. During a manufacturing process for the display device 10, the orientation signal applied to the electrode lines RM1 and RM2 may be transmitted to the electrodes RME1 and RME2, and the light emitting elements ED may be arranged or disposed by the electric field generated in the electrodes. Thereafter, in the following process, a process of separating the first electrode RME1 and the first electrode branch part RM1_B is performed, and the first electrode RME1 may be connected to only the first transistor T1 connected to each sub-pixel PXn. On the other hand, the second electrode RME2 may remain in a state of being connected to the second electrode branch part RM2_B, and the second power voltage may be applied to the second electrode RME2 from the second electrode line RM2 connected to the second voltage wiring VSL.

The electrodes RME1 and RME2 may be electrically connected to the light emitting element ED. Further, the electrodes RME1 and RME2 may be connected to the third conductive layer, and a signal for allowing the light emitting element ED to emit light may be applied to the electrodes RME1 and RME2. The first electrode RME1 may be electrically connected to the third conductive layer through a first electrode contact hole CTD, and the second electrode RME2 may be electrically connected to the third conductive layer through a second electrode contact hole CTS formed in the second electrode line RM2. For example, the first electrode RME1 may include electrode contact parts CTP formed in portions of the light emitting areas EMA1, EMA2, and EMA3 in which the first bank BNL1 is not disposed, and the second electrode RME2 may be in contact with the second conductive pattern DP2 through a second electrode contact hole CTS that is formed in an area in which the second electrode line RM2 disposed in the non-light emitting area overlaps the second bank BNL2 and that passes through the second interlayer insulating layer IL2. The first electrode RME1 may be electrically connected to the first transistor T1, and the first power voltage is applied to the first electrode RME1. The second electrode RME2 may be electrically connected to the second voltage wiring VSL through the second electrode line RM2 and the second conductive pattern DP2, and the second power voltage may be applied to the second electrode RME2. Since the first electrode RME1 is separated for each pixel PX and each sub-pixel PXn, the light emitting elements ED of different sub-pixels PXn may individually emit light.

The electrodes RME1 and RME2 and the electrode lines RM1 and RM2 may be formed as a fourth conductive layer. The fourth conductive layer may include a conductive material having high reflectivity. For example, the electrodes RME1 and RME2 may include a metal such as silver (Ag), copper (Cu), or aluminum (Al) as a material having high reflectivity or may be an alloy including aluminum (Al), nickel (Ni), or lanthanum (La). The electrodes RME1 and RME2 may reflect light emitted from the light emitting element ED and traveling to the side surface of the first bank BNL1 in the upward direction of each sub-pixel PXn.

However, the disclosure is not limited thereto, and the electrodes RME1 and RME2 may further include a transparent conductive material. For example, the electrodes RME1 and RME2 may include a material such as ITO, IZO, or ITZO. In an embodiment, the electrodes RME1 and RME2 may have a structure in which one or more layers of a transparent conductive material and a metal layer having high reflectivity are stacked or may be formed as one layer or as a layer including the transparent conductive material and the metal layer. For example, the electrodes may have a stacked structure such as ITO/Ag/ITO, ITO/Ag/IZO, or ITO/Ag/ITZO/IZO.

The first insulating layer PAS1 is disposed on the electrodes RME1 and RME2 and the first bank BNL1. The first insulating layer PAS1 may be disposed to cover or overlap the first banks BNL1, the first electrode RME1, and the second electrodes RME2 and may be disposed so that parts of the upper surfaces of the first electrode RME1 and the second electrode RME2 are exposed. An opening through which upper surfaces of parts of the electrodes RME1 and RME2, the parts being disposed on the first bank BNL1, are exposed may be formed in the first insulating layer PAS1, and the contact electrodes CNE1 and CNE2 may be in contact with the electrodes RME1 and RME2 through the opening.

In an embodiment, the first insulating layer PAS1 may have a step formed between the first electrode RME1 and the second electrode RME2 so that a portion of the upper surface thereof is recessed. As the first insulating layer PAS1 is disposed to cover or overlap the first electrode RME1 and the second electrode RME2, the first insulating layer PAS1 may be stepped therebetween. However, the disclosure is not limited thereto. The first insulating layer PAS1 can protect the first electrode RME1 and the second electrode RME2 while insulating the first electrode RME1 and the second electrode RME2 from each other. Further, the light emitting element ED disposed on the first insulating layer PAS1 can be prevented from being damaged by being in direct contact with other members.

The second bank BNL2 may be disposed on the first insulating layer PAS1. The second bank BNL2 may include a part extending in the first direction DR1 and the second direction DR2 and may be disposed in a grid pattern when viewed from above. The second bank BNL2 may be disposed across a boundary between the sub-pixels PXn, and thus a user may distinguish neighboring sub-pixels PXn. Further, the second bank BNL2 may be disposed to surround the light emitting areas EMA1, EMA2, and EMA3 and the cut areas CBA arranged or disposed in each sub-pixel PXn, and thus the user may distinguish these areas. Among parts of the second bank BNL2 in the second direction DR2, a part disposed between the light emitting areas EMA1, EMA2, and EMA3 and a part disposed between the cut areas CBA may have the same width. Accordingly, a gap between the cut areas CBA may be the same as a gap between the light emitting areas EMA1, EMA2, and EMA3. However, the disclosure is not limited thereto.

The second bank BNL2 may be formed to have a height larger than the first bank BNL1. The second bank BNL2 may prevent ink from overflowing to the adjacent sub-pixel PXn in an inkjet printing process of the manufacturing process for the display device 10, and thus different light emitting elements ED of different sub-pixels PXn may be separated so that the dispersed ink is not mixed together. As one first bank BNL1 is disposed across the adjacent sub-pixel PXn in the first direction DR1, a portion of the second bank BNL2 extending in the second direction DR2 may be disposed on the first bank BNL1. Like the first bank BNL1, the second bank BNL2 may include polyimide (PI), but the disclosure is not limited thereto.

The light emitting element ED may be disposed on the first insulating layer PAS1. The light emitting elements ED may be spaced apart from each other in the second direction DR2 in which the electrodes RME1 and RME2 extend and may be arranged or disposed substantially parallel to each other. The light emitting element ED may have a shape extending in one direction, and a direction in which the electrodes RME1 and RME2 extend and a direction in which the light emitting element ED extends may be arranged or disposed substantially perpendicular to each other. However, the disclosure is not limited, and the light emitting element ED may be disposed obliquely in the direction in which the electrodes RME1 and RME2 extend.

The light emitting element ED may include semiconductor layers doped with different conductive types. The light emitting element ED may include semiconductor layers and may be oriented so that one end thereof faces a side in the direction of the electric field generated on the electrodes RME1 and RME2. Further, the light emitting element ED may include a light emitting layer 36 (see FIG. 7) and may emit light in a wavelength band. The light emitting elements ED arranged or disposed in each sub-pixel PXn may emit light in different wavelength bands depending on a material constituting the light emitting layer 36. However, the disclosure is not limited thereto, and the light emitting elements ED arranged or disposed in each sub-pixel PXn may emit light having the same color.

The light emitting element ED may be disposed on the electrodes RME1 and RME2 between the first banks BNL1. For example, the light emitting element ED may be disposed so that one end thereof is placed on the first electrode RME1 and the other end thereof is placed on the second electrode RME2. The extension length of the light emitting element ED may be longer than the distance between the first electrode RME1 and the second electrode RME2, and both ends of the light emitting element ED may be arranged or disposed on the first electrode RME1 and the second electrode RME2, respectively.

Layers formed of the light emitting elements ED may be arranged or disposed in a direction parallel to the upper surface of the first substrate SUB. The light emitting element ED of the display device 10 may be disposed so that one extending direction thereof is parallel to the first substrate SUB, and the semiconductor layers included in the light emitting element ED may be sequentially arranged or disposed in the direction parallel to the upper surface of the first substrate SUB. However, the disclosure is not limited thereto. In case that the light emitting element ED has a different structure, the semiconductor layers may be arranged or disposed in a direction perpendicular to the first substrate SUB.

Both ends of the light emitting element ED may be in contact with the contact electrodes CNE1 and CNE2. In the light emitting element ED, since an insulating film 38 (see FIG. 7) is not formed on an end surface in the one extending direction and a portion of the semiconductor layer is exposed, the exposed semiconductor layer may be in contact with the contact electrodes CNE1 and CNE2. However, the disclosure is not limited thereto. In the light emitting element ED, at least a partial area of the insulating film 38 may be removed, and since the insulating film 38 is removed, side surfaces at both ends of the semiconductor layers may be partially exposed. The exposed side surfaces of the semiconductor layer may be in direct contact with the contact electrodes CNE1 and CNE2.

The second insulating layer PAS2 may be partially disposed on the light emitting element ED. As an example, the second insulating layer PAS2 is disposed to partially cover or overlap the outer surface of the light emitting element ED and is disposed so as not to cover or overlap one end or an end and the other end or another end of the light emitting element ED. The contact electrodes CNE1 and CNE2, which will be described below, may be in contact with both ends of the light emitting element ED not covered or overlapped by the second insulating layer PAS2. As a portion of the second insulating layer PAS2 disposed on the light emitting element ED is disposed to extend from the first insulating layer PAS1 in the second direction DR2 in the plan view, linear or island-like patterns may be formed. The second insulating layer PAS2 may protect the light emitting element ED while fixing the light emitting element ED in the manufacturing process for the display device 10.

During the manufacturing process for the display device 10, a cutting process for forming the electrodes RME1 and RME2 by separating the electrode lines after the electrode lines are formed may be performed after the second insulating layer PAS2 is formed. The second insulating layer PAS2 may not be disposed in the cut area CBA and may be disposed only in the light emitting areas EMA1, EMA2, and EMA3, and only the electrodes RME1 and RME2 and the first insulating layer PAS1 may be arranged or disposed in the cut area CBA. The electrodes RME1 and RME2 may be spaced apart from the cut area CBA, the second interlayer insulating layer IL2 may be exposed, and the first insulating layer PAS1 may be separated and disposed on the separated electrodes RME1 and RME2.

The contact electrodes CNE1 and CNE2 may be arranged or disposed on the second insulating layer PAS2. The first contact electrode CNE1 and the second contact electrode CNE2 of the contact electrodes CNE1 and CNE2 may be arranged or disposed on parts of the first electrode RME1 and the second electrode RME2, respectively. The first contact electrode CNE1 may be disposed on the first electrode RME1, the second contact electrode CNE2 may be disposed on the second electrode RME2, and the first contact electrode CNE1 and the second contact electrode CNE2 may have a shape extending in the second direction DR2. The first contact electrode CNE1 and the second contact electrode CNE2 may be spaced apart from and face each other in the first direction DR1, and the first contact electrode CNE1 and the second contact electrode CNE2 may form a linear pattern in the light emitting areas EMA1, EMA2, and EMA3 of each sub-pixel PXn.

In an embodiment, the width of the first contact electrode CNE1 and the second contact electrode CNE2 measured in one direction may be smaller than the width of the first electrode RME1 and the second electrode RME2 measured in the one direction. The first contact electrode CNE1 and the second contact electrode CNE2 may be in contact with one end and the other end of the light emitting element ED, respectively, while being arranged or disposed on portions of the upper surfaces of the first electrode RME1 and the second electrode RME2.

The contact electrodes CNE1 and CNE2 may be in contact with the light emitting element ED and the electrodes RME1 and RME2, respectively. The semiconductor layer may be exposed to both end surfaces of the light emitting element ED in an extending direction, and the first contact electrode CNE1 and the second contact electrode CNE2 may be in contact with the light emitting element ED on the end surfaces to which the semiconductor layer is exposed. One end of the light emitting element ED may be electrically connected to the first electrode RME1 through the first contact electrode CNE1, and the other end thereof may be electrically connected to the second electrode RME2 through the second contact electrode CNE2.

Although it is illustrated in the drawing that one first contact electrode CNE1 and one second contact electrode CNE2 are arranged or disposed in one sub-pixel PXn, the disclosure is not limited thereto. The numbers of the first contact electrode CNE1 and the second contact electrode CNE2 may change depending on the numbers of the first electrode RME1 and the second electrode RME2 arranged or disposed in each sub-pixel PXn.

The contact electrodes CNE1 and CNE2 may include a conductive material. For example, the contact electrodes CNE1 and CNE2 may include ITO, IZO, ITZO, aluminum (Al), or the like within the spirit and the scope of the disclosure. As an example, the contact electrodes CNE1 and CNE2 may include a transparent conductive material, and the light emitted from the light emitting element ED may pass through the contact electrodes CNE1 and CNE2 and travel toward the electrodes RME1 and RME2. However, the disclosure is not limited thereto.

Although not illustrated in the drawing, an insulating layer covering or overlapping the contact electrodes CNE1 and CNE2 and the second bank BNL2 may be further arranged or disposed on the contact electrodes CNE1 and CNE2 and the second bank BNL2. The insulating layer may be disposed on an entirety of the first substrate SUB and function to protect members arranged or disposed on the first substrate SUB from external environments.

Each of the first insulating layer PAS1 and the second insulating layer PAS2 described above may include an inorganic insulating material or organic insulating material. In an embodiment, the first insulating layer PAS1 and the second insulating layer PAS2 may include an inorganic insulating material such as silicon oxide ($SiO_x$), silicon nitride ($SiN_x$), silicon oxynitride ($SiO_xN_y$), aluminum oxide ($Al_2O_3$), or aluminum nitride (AlN). As an example, the first insulating layer PAS1 and the second insulating layer PAS2 may include, as an organic insulating material, acrylic resin, epoxy resin, phenol resin, polyamide resin, polyimide resin, unsaturated polyester resin, polyphenylene resin, polyphenylene sulfide resin, benzocyclobutene, cardo resin, siloxane resin, silsesquioxane resin, polymethyl methacrylate, polycarbonate, polymethyl methacrylate-polycarbonate synthetic resin, or the like within the spirit and the scope of the disclosure. However, the disclosure is not limited thereto.

Figure 7:
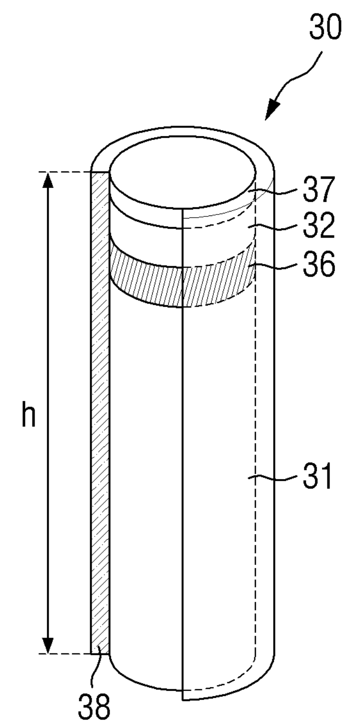
FIG. 7 is a schematic view of a light emitting element according to an embodiment.

FIG. 7 is a schematic view of a light emitting element according to an embodiment.

The light emitting element 30 may be an LED, and by way of example, the light emitting element 30 may be an inorganic LED having a size of a micrometer or nanometer scale and made of inorganic matter. The inorganic LEDs may be arranged or disposed between two electrodes facing each other that form a polarity in case that an electric field is formed in a direction between the two electrodes. The light emitting elements 30 may be arranged or disposed between the electrodes by the electric field formed on the two electrodes.

The light emitting element 30 according to an embodiment may have a shape extending in one direction. The light emitting element 30 may have a shape such as substantially a rod, a wire, and a tube. In an embodiment, the light emitting element 30 may have a substantially cylindrical shape or a substantially rod shape. However, the shape of the light emitting element 30 is not limited thereto, and the light emitting element 30 may have one of various shapes including a shape of a substantially polygonal column such as a substantially regular hexahedron, a substantially rectangular parallelepiped, and a substantially hexagonal column or a shape that extends in one direction but has a partially inclined outer surface. Semiconductors included in the light emitting element 30, which will be described below, may have a structure in which the semiconductors are sequentially arranged or disposed or stacked each other in the one direction or in a direction.

The light emitting element 30 may include a semiconductor layer doped with a conductive type (for example, a p type or an n type) impurity. The semiconductor layer may receive an electrical signal applied from an external power source and may emit light in a wavelength band.

Referring to FIG. 7, the light emitting element 30 may include a first semiconductor layer 31, a second semiconductor layer 32, a light emitting layer 36, an electrode layer 37, and an insulating film 38.

The first semiconductor layer 31 may be an n-type semiconductor. As an example, in case that the light emitting element 30 emits light in the blue wavelength band, the first semiconductor layer 31 may include a semiconductor material having a chemical formula of $Al_xGa_yIn1\text{-}x\text{-}yN$ ($0 \le x \le 1$, $0 \le y \le 1$ and $0 \le x+y \le 1$). For example, the semiconductor material may be one or more of n-type doped AlGaInN, GaN, AlGaN, InGaN, AlN, and InN. The first semiconductor layer 31 may be doped with an n-type dopant, and for example, the n-type dopant may be Si, Ge, Sn, or the like within the spirit and the scope of the disclosure. In an embodiment, the first semiconductor layer 31 may be n-GaN doped with n-type Si. Although a length of the first semiconductor layer 31 may be in the range of about 1.5 μm to about 5 μm, the disclosure is not limited thereto.

The second semiconductor layer 32 is disposed on the light emitting layer 36 which will be described below. The second semiconductor layer 32 may be a p-type semiconductor, and as an example, in case that the light emitting element 30 emits light in the wavelength band of blue or green, the second semiconductor layer 32 may include a semiconductor material having a chemical formula of $Al_xGa_yIn1\text{-}x\text{-}yN$ ($0 \le x \le 1, 0 \le y \le 1$ and $0 \le x+y \le 1$). For example, the semiconductor material 32 may be one or more of p-type doped AlGaInN, GaN, AlGaN, InGaN, AlN, and InN. The second semiconductor layer 32 may be doped with a p-type dopant, and for example, the p-type dopant may be Mg, Zn, Ca, Se, Ba, or the like within the spirit and the scope of the disclosure. In an embodiment, the second semiconductor layer 32 may be p-GaN doped with p-type Mg. Although the length of the second semiconductor layer 32 may be in the range of about 0.05 μm to about 0.10 μm, the disclosure is not limited thereto.

Although it is illustrated in the drawing that the first semiconductor layer 31 and the second semiconductor layer 32 may be one layer or a layer, the disclosure is not limited thereto. According to an embodiment, depending on the material of the light emitting layer 36, the first semiconductor layer 31 and the second semiconductor layer 32 may further include a larger number of layers, for example, a clad layer or a tensile strain barrier reducing (TSBR) layer.

The light emitting layer 36 is disposed between the first semiconductor layer 31 and the second semiconductor layer 32. The light emitting layer 36 may include a material having a single or multiple quantum well structure. In case that the light emitting layer 36 may include the material having the multiple quantum well structure, the light emitting layer 36 may have a structure in which quantum layers and well layers may be alternately laminated. The light emitting layer 36 may emit light by a combination of an electron-hole pair according to an electric signal applied through the first semiconductor layer 31 and the second semiconductor layer 32. As an example, in case that the light emitting layer 36 emits light in the blue wavelength band, the light emitting layer 36 may include a material such as AlGaN or AlGaInN. By way of example, in case that the light emitting layer 36 has a multiple quantum well structure in which quantum layers and well layers may be alternately laminated, the quantum layer may include AlGaN or AlGaInN, and the well layer may include GaN or AlInN. In an embodiment, the light emitting layer 36 may include AlGaInN as the quantum layer and AlInN as the well layer, and as described above, the light emitting layer 36 may emit blue light whose central wavelength band is in the range of about 450 nm to about 495 nm.

However, the disclosure is not limited thereto. The light emitting layer 36 may have a structure in which semiconductor materials having large bandgap energy and semiconductor materials having small bandgap energy may be alternately laminated and may include other semiconductor materials in groups III to V according to the wavelength band of the emitted light. The light emitted by the light emitting layer 36 is not limited to the light in the blue wavelength band, and, the light emitting layer 36 may emit light in the wavelength band of red or green. Although the length of the light emitting layer 36 may be in the range of about 0.05 μm to about 0.10 the disclosure is not limited thereto.

The light emitted by the light emitting layer 36 may be emitted not only to the outer surface of the light emitting element 30 in the lengthwise direction but also to both side surfaces. The directionality of the light emitted by the light emitting layer 36 is not limited to one direction.

The electrode layer 37 may be an ohmic contact electrode. However, the disclosure is not limited thereto, and the electrode layer 37 may be a Schottky contact electrode. The light emitting element 30 may include at least one electrode layer 37. Although it is illustrated in the drawing that the light emitting element 30 may include one electrode layer 37, the disclosure is not limited thereto. The light emitting element 30 may include a larger number of electrode layers 37 or the electrode layers 37 may be omitted. The following description of the light emitting element 30 may be equally applied even in case that the number of electrode layers 37 is changed or other structures are further included.

In the display device 10 according to one embodiment, in case that the light emitting element 30 is electrically connected to the electrode or the contact electrode, the electrode layer 37 can reduce resistance between the light emitting element 30 and the electrode or the contact electrode. The electrode layer 37 may include a conductive metal. For example, the electrode layer 37 may include at least one of aluminum (Al), titanium (Ti), indium (In), gold (Au), silver (Ag), indium tin oxide (ITO), indium zinc oxide (IZO), and indium tin zinc oxide (ITZO). Further, the electrode layer 37 may include a semiconductor material doped with an n-type or p-type impurity. The electrode layer 37 may include the same material or similar material or different materials, and the disclosure is not limited thereto.

The insulating film 38 is disposed to surround the outer surfaces of the semiconductor layers and the electrode layers described above. In an embodiment, the insulating film 38 may be disposed to surround at least the outer surface of the light emitting layer 36 or may extend in one direction in which the light emitting element 30 extends. The insulating film 38 may function to protect the above members. As an example, the insulating film 38 may be formed to surround the side surfaces of the members and may be formed so that both ends of the light emitting element 30 in a lengthwise direction are exposed.

Although it is illustrated in the drawing that the insulating film 38 is formed to extend in the lengthwise direction of the light emitting element 30 and to cover or overlap from the first semiconductor layer 31 to a side surface of the electrode layer 37, the disclosure is not limited thereto. The insulating film 38 may cover or overlap only a partial outer surface of the semiconductor layer in addition to the light emitting layer 36 or cover or overlap only a partial outer surface of the electrode layer 37, and thus the outer surface of the electrode layer 37 may be partially exposed. Further, the insulating film 38 may be formed such that the upper surface in a cross section in a region adjacent to at least one end of the light emitting element 30 is round.

Although the thickness of the insulating film 38 may be in the range of about 10 nm to about 1.0 the disclosure is not limited thereto. By way of example, the thickness of the insulating film 38 may be about 40 nm.

The insulating film 38 may include a material having insulating properties, for example, silicon oxide ($SiO_x$), silicon nitride ($SiN_x$), silicon oxynitride ($SiO_xN_y$), aluminum nitride (AlN), aluminum oxide ($Al_2O_3$), or the like within the spirit and the scope of the disclosure. Accordingly, an electrical short circuit that may occur in case that the light emitting layer 36 is in contact or direct contact with an electrode, through which an electrical signal is transmitted to the light emitting element 30, can be prevented. Further, since the insulating film 38 protects the outer surface of the light emitting element 30 in addition to the light emitting layer 36, a decrease in luminous efficiency can be prevented.

Further, in an embodiment, the outer surface of the insulating film 38 may be surface-treated. The light emitting elements 30 may be sprayed and arranged or disposed onto the electrode in a state of being dispersed in an ink. Here, in order for the light emitting elements 30 to remain in a dispersed state without being aggregated with other adjacent light emitting elements 30 in the ink, the surface of the insulating film 38 may be subjected to hydrophobic or hydrophilic treatment.

The light emitting element 30 may have a length h of a range of about 1 μm to about about 2 μm to about 6 and by way of example, about 3 μm to about 5 Further, a diameter of the light emitting element 30 may be in the range of about 30 nm to about 700 nm, and an aspect ratio of the light emitting element 30 may be in the range of about 1.2 to about 100. However, the disclosure is not limited thereto. The light emitting elements 30 included in the display device 10 may have different diameters according to a composition difference of the light emitting layer 36. By way of example, the diameter of the light emitting element 30 may be about 500 nm.

As described above, the display device 10 according to an embodiment may include the first voltage wiring VDL, the second voltage wiring VSL, the first data wiring DTL1, the second data wiring DTL2, the third data wiring DTL3, and the initialization voltage wiring VIL which are connected to each pixel PX. These wirings may extend from the non-display area NDA and be connected to a driving circuit. For example, the initialization voltage wiring VIL and the first to third data wirings DTL1, DTL2, and DTL3 may extend to the driving circuit. The first voltage wiring VDL may extend to a first auxiliary wiring, and the second voltage wiring VSL may extend to a second auxiliary wiring.

In the non-display area NDA, the initialization voltage wiring VIL and the first to third data wirings DTL1, DTL2, and DTL3 are arranged or disposed on the lowermost layer, the first auxiliary wiring is disposed on the initialization voltage wiring VIL and the first to third data wirings DTL1, DTL2, and DTL3, the second auxiliary wiring is disposed on the first auxiliary wiring, the insulating film is disposed between the wirings, and thus the wirings may overlap each other. A seam may be generated in the insulating film due to a step between the initialization voltage wiring VIL and the first to third data wirings DTL1, DTL2, and DTL3, and a short circuit or burnt circuit may occur between the first auxiliary wiring and the second auxiliary wiring formed on the insulating film.

Hereinafter, a display device will be disclosed which can prevent the short circuit or burnt circuit between the first auxiliary wiring and the second auxiliary wiring.

Figure 8:
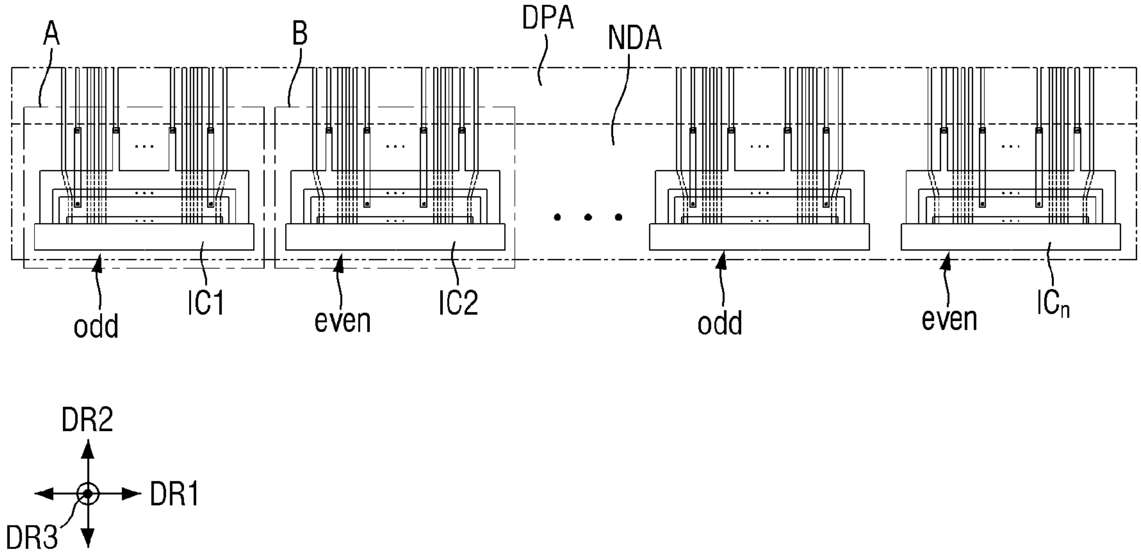
FIG. 8 is a schematic plan view illustrating a non-display region of the display device according to an embodiment.
Figure 9:
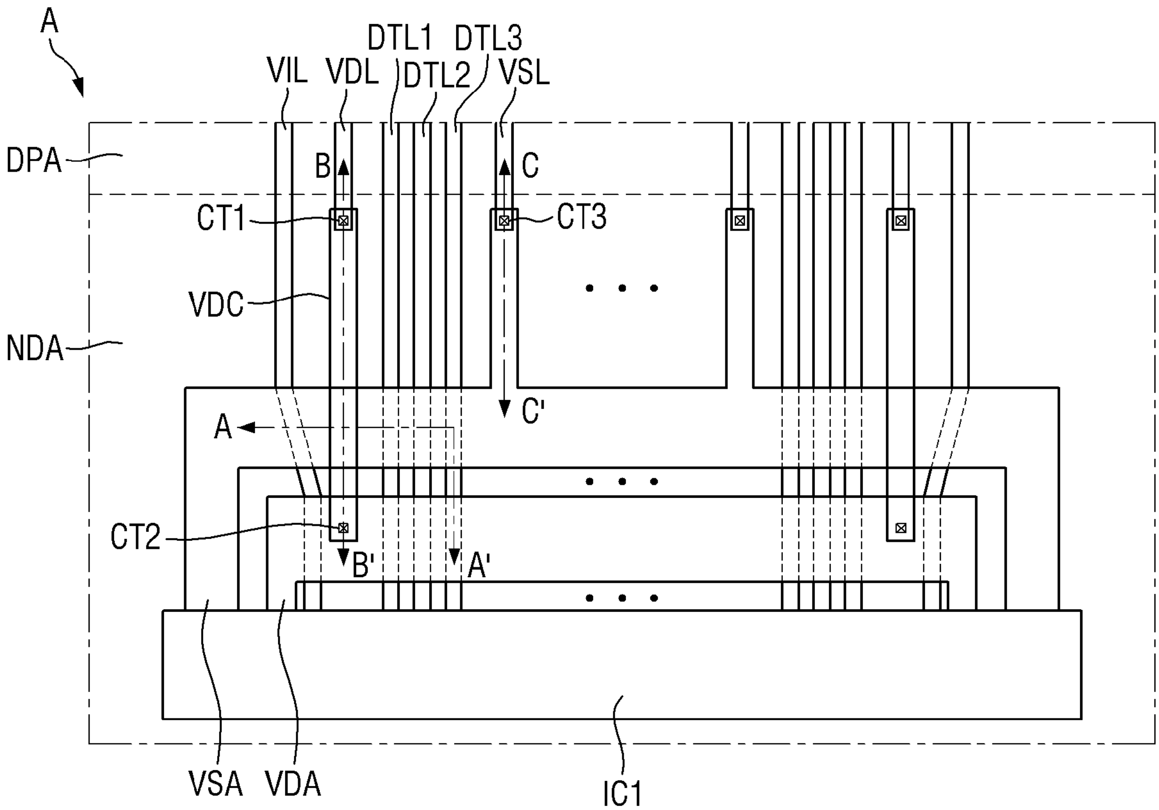
FIG. 9 is an enlarged view schematically illustrating an area A of FIG. 8.
Figure 10:
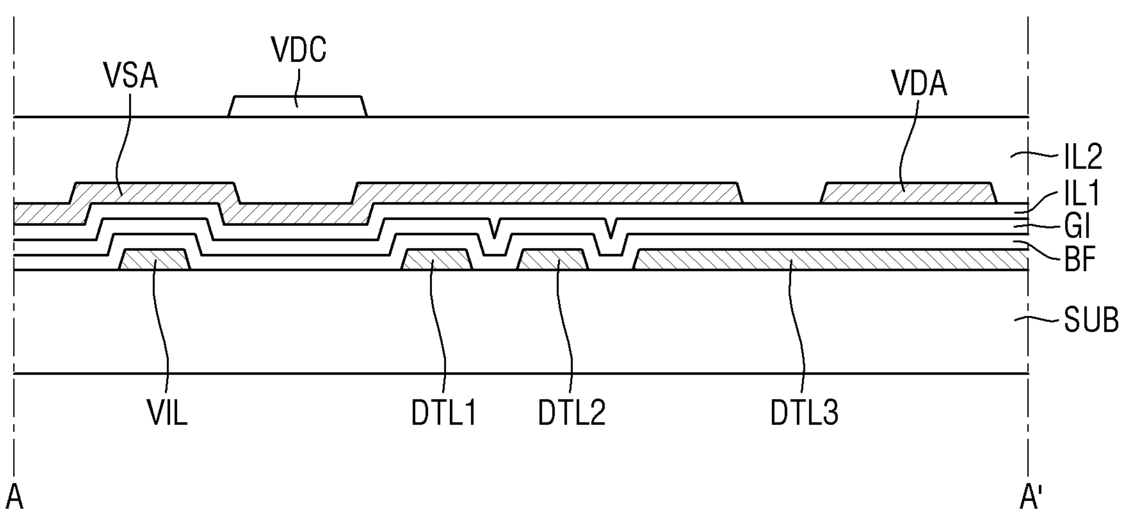
FIG. 10 is a schematic cross-sectional view taken along line A-A' of FIG. 9.
Figure 11:
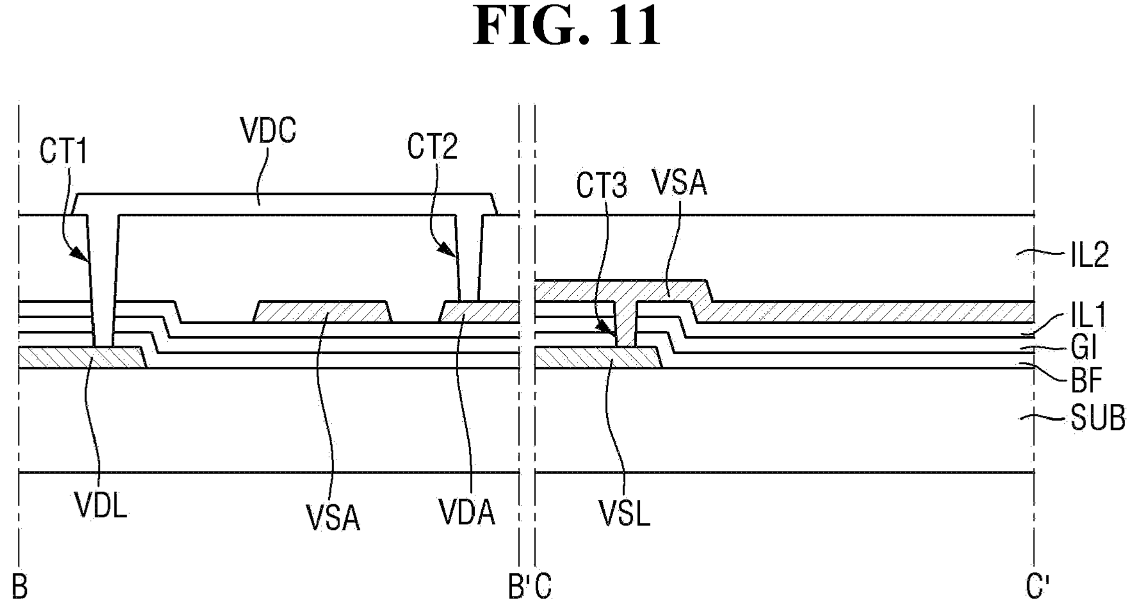
FIG. 11 is a schematic cross-sectional view taken along lines B-B' and C-C' of FIG. 9.
Figure 12:
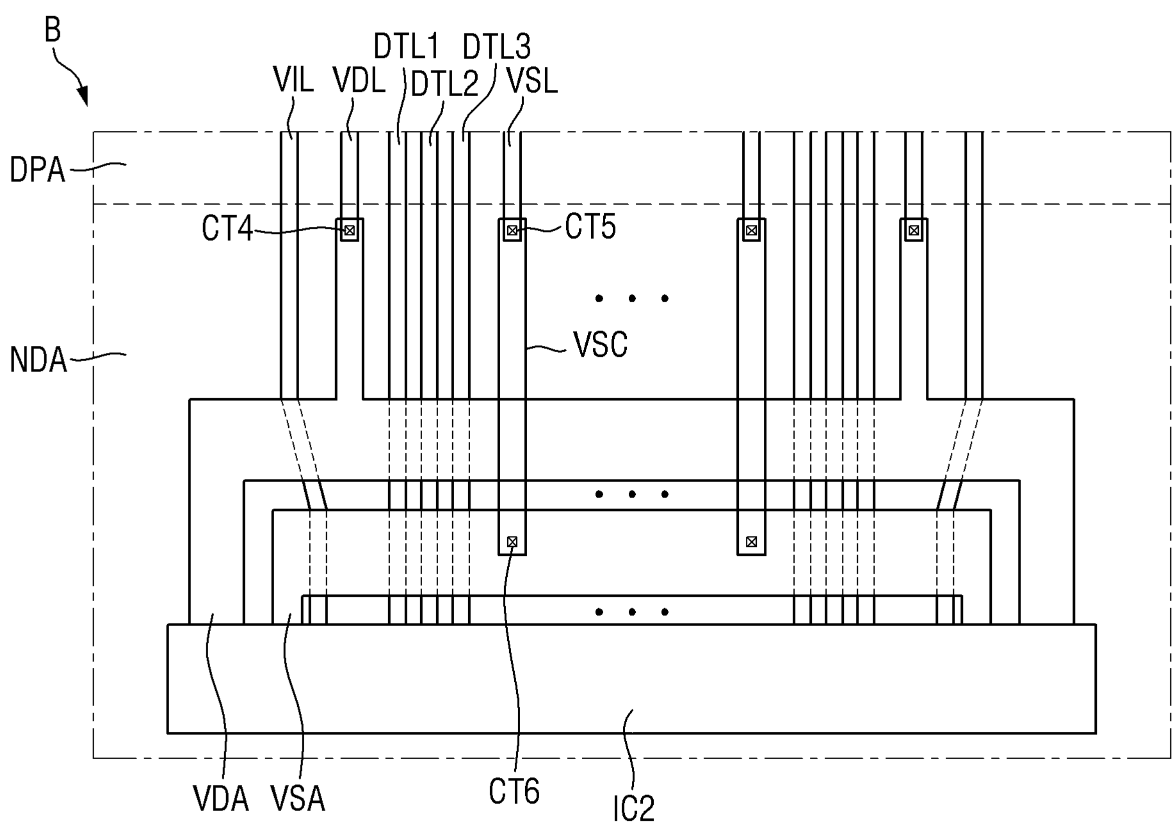
FIG. 12 is an enlarged view schematically illustrating an area B of FIG. 8.

FIG. 8 is a schematic plan view illustrating a non-display region of the display device according to an embodiment. FIG. 9 is an enlarged view schematically illustrating an area A of FIG. 8. FIG. 10 is a schematic cross-sectional view taken along line A-A' of FIG. 9. FIG. 11 is a schematic cross-sectional view taken along lines B-B' and C-C' of FIG. 9. FIG. 12 is an enlarged view schematically illustrating an area B of FIG. 8.

Referring to FIG. 8, the display device 10 according to an embodiment may include the non-display area NDA surrounding or adjacent to the display area DPA, and the wirings and the driving circuits ICn may be arranged or disposed in the non-display area NDA. The number of driving circuits ICn arranged or disposed in the non-display area NDA may be variously adjusted according to the resolution of the display device 10.

Referring to FIGS. 8 and 9, in the display device 10 according to an embodiment, the first voltage wiring VDL, the second voltage wiring VSL, the initialization voltage wiring VIL, the first data wiring DTL1, the second data wiring DTL2, and the third data wiring DTL3 may be connected to each driving circuit ICn. These wirings may be wirings extending from one pixel PX (see FIG. 4) of the display area DPA to the non-display area NDA. The first voltage wiring VDL, the second voltage wiring VSL, the initialization voltage wiring VIL, the first data wiring DTL1, the second data wiring DTL2, and the third data wiring DTL3 may be formed as the first conductive layer in the display area DPA and extend to the non-display area NDA.

The driving circuit ICn may include an odd-numbered driving circuit odd and an even-numbered driving circuit even. According to an embodiment, the first voltage wiring VDL and the second voltage wiring VSL connected to the odd-numbered driving circuit odd may have a connection structure different from that of the first voltage wiring VDL and the second voltage wiring VSL connected to the even-numbered driving circuit even.

First, referring to FIGS. 9 to 11, a first driving circuit odd among the odd-numbered driving circuit odd will be described.

The initialization voltage wiring VIL may extend from the display area DPA to the non-display area NDA and be connected to a first driving circuit IC1. The initialization voltage wiring VIL may be formed as the first conductive layer in the display area DPA and may integrally extend to the non-display area NDA.

The first data wiring DTL1, the second data wiring DTL2, and the third data wiring DTL3 may extend from the display area DPA to the non-display area NDA and be connected to the first driving circuit IC1. The first data wiring DTL1, the second data wiring DTL2, and the third data wiring DTL3 may be formed as the first conductive layer in the display area DPA and may integrally extend to the non-display area NDA.

In the display device 10 according to an embodiment, a first auxiliary wiring VDA and a second auxiliary wiring VSA may be arranged or disposed in the non-display area NDA adjacent to the first driving circuit IC1. The first auxiliary wiring VDA may have one end or an end and the other end or another end connected to the first driving circuit IC1. The first auxiliary wiring VDA may be a wiring to which the first voltage wirings VDL extending from the display area DPA are connected.

The second auxiliary wiring VSA may have one end and the other end connected to the first driving circuit IC1. The second auxiliary wiring VSA may be disposed in a shape surrounding the first auxiliary wiring VDA and disposed closer to the display area DPA than the first auxiliary wiring VDA in the plan view. The second auxiliary wiring VSA may be a wiring to which the second voltage wirings VSL extending from the display area DPA are connected.

The first auxiliary wiring VDA and the second auxiliary wiring VSA described above may be formed as the third conductive layer and arranged or disposed to be spaced apart from each other in the plan view.

The first voltage wiring VDL may extend from the display area DPA to the non-display area NDA and be connected to the first driving circuit IC1. The first voltage wiring VDL may be formed as the first conductive layer in the display area DPA and extend to the non-display area NDA. The first voltage wiring VDL may be connected to the first driving circuit IC1 by being jumped from the non-display area NDA to the first connection wiring VDC and connected to the first auxiliary wiring VDA.

The second voltage wiring VSL may extend from the display area DPA to the non-display area NDA and be connected to the first driving circuit IC1. The second voltage wiring VSL may be formed as the first conductive layer in the display area DPA and extend to the non-display area NDA. The second voltage wiring VSL may be connected to the first driving circuit IC1 by being connected to the second auxiliary wiring VSA in the non-display area NDA.

As described above, the first voltage wiring VDL may be connected to the first auxiliary wiring VDA by being jumped to the first connection wiring VDC. For the jumping, the first connection wiring VDC may be formed as the fourth conductive layer. In the non-display area NDA, the first voltage wiring VDL may be connected to the first connection wiring VDC through a first contact hole CT1, and the first connection wiring VDC may be connected to the first auxiliary wiring VDA through a second contact hole CT2. Accordingly, the first voltage wiring VDL may be connected to the first auxiliary wiring VDA through the first connection wiring VDC.

The first connection wiring VDC may extend in the second direction DR2 and intersect the second auxiliary wiring VSA extending in the first direction DR1. The first connection wiring VDC and the second auxiliary wiring VSA may be arranged or disposed to overlap each other in the third direction DR3. The first connection wirings VDC may be arranged or disposed to overlap each other in the third direction DR3, and the second contact hole CT2 may be disposed in the overlapped area and thus connected to the first auxiliary wiring VDA.

The second voltage wiring VSL may be connected to the second auxiliary wiring VSA in the non-display area NDA. The second voltage wirings VSL may overlap the second auxiliary wiring VSA in the non-display area NDA and be connected to each other through a third contact hole CT3 in the overlapped area.

The first auxiliary wiring VDA and the second auxiliary wiring VSA may overlap the initialization voltage wiring VIL, the first data wiring DTL1, the second data wiring DTL2, and the third data wiring DTL3 in the third direction DR3.

Referring to FIGS. 10 and 11 in conjunction with FIG. 9, the first conductive layer may be disposed on the first substrate SUB. The first conductive layer may include the initialization voltage wiring VIL, the first data wiring DTL1, the second data wiring DTL2, the third data wiring DTL3, the first voltage wiring VDL, and the second voltage wiring VSL. The initialization voltage wiring VIL, the first data wiring DTL1, the second data wiring DTL2, the third data wiring DTL3, the first voltage wiring VDL, and the second voltage wiring VSL may be arranged or disposed to be coplanar, for example, on the first substrate SUB.

The buffer layer BF, the first gate insulating layer GI, and the first interlayer insulating layer IL1 may be sequentially arranged or disposed on the initialization voltage wiring VIL, the first data wiring DTL1, the second data wiring DTL2, the third data wiring DTL3, the first voltage wiring VDL, and the second voltage wiring VSL.

The third conductive layer may be disposed on the first interlayer insulating layer ILL The third conductive layer may include the first auxiliary wiring VDA and the second auxiliary wiring VSA. The first auxiliary wiring VDA and the second auxiliary wiring VSA may be arranged or disposed to be coplanar, for example, on the first interlayer insulating layer IL1.

In detail, the first auxiliary wiring VDA may be disposed to overlap the initialization voltage wiring VIL, the first data wiring DTL1, the second data wiring DTL2, and the third data wiring DTL3. The second auxiliary wiring VSA may be disposed to overlap the initialization voltage wiring VIL, the first data wiring DTL1, the second data wiring DTL2, and the third data wiring DTL3. The second auxiliary wiring VSA may be connected to the second voltage wiring VSL through the third contact hole CT3 passing through the buffer layer BF, the first gate insulating layer GI, and the first interlayer insulating layer IL1 and exposing the second voltage wiring VSL.

The second interlayer insulating layer IL2 may be disposed on the first auxiliary wiring VDA and the second auxiliary wiring VSA. The fourth conductive layer may be disposed on the second interlayer insulating layer IL2. The fourth conductive layer may include the first connection wiring VDC. The first connection wiring VDC may be disposed to overlap the first voltage wiring VDL, the first auxiliary wiring VDA, and the second auxiliary wiring VSA. The first connection wiring VDC may be connected to the first voltage wiring VDL through the first contact hole CT1 passing through the buffer layer BF, the first gate insulating layer GI, the first interlayer insulating layer ILL and the second interlayer insulating layer IL2 and exposing the first voltage wiring VDL. Further, the first connection wiring VDC may be connected to the first auxiliary wiring VDA through the second contact hole CT2 passing through the second interlayer insulating layer IL2 and exposing the first auxiliary wiring VDA.

In the above-described embodiment, in the non-display area NDA, the initialization voltage wiring VIL, the first data wiring DTL1, the second data wiring DTL2, and the third data wiring DTL3 formed as the first conductive layer are formed, the first auxiliary wiring VDA and the second auxiliary wiring VSA formed as the third conductive layer are formed, and the first connection wiring VDC formed as the fourth conductive layer is formed. For example, in the non-display area NDA, since a conductive layer is not disposed between the first conductive layer and the third conductive layer, the occurrence of a short circuit between the conductive layers stacked on the upper side can be prevented due to a step by the first conductive layer.

As described above, as illustrated in FIGS. 9 to 11, in the first driving circuit ICn, the first voltage wiring VDL may be jumped to the first connection wiring VDC to be connected to the first auxiliary wiring VDA. In all of the driving circuits ICn, in case that the first voltage wiring VDL is jumped to the first connection wiring VDC to be connected to the first auxiliary wiring VDA, heat or a burnt circuit may occur in the contact holes due to contact resistance of the jumped contact holes.

In an embodiment, as illustrated in FIGS. 9 to 11 described above, in the first driving circuit IC1 that is the odd-numbered driving circuit, the first voltage wiring VDL may be jumped to the first connection wiring VDC to be connected to the first auxiliary wiring VDA.

Referring to FIG. 12, a connection relationship between wirings in a second driving circuit IC2 that is an even-numbered driving circuit will be described. Hereinafter, a connection relationship between different wirings from the wirings in the odd-numbered driving circuit illustrated in FIG. 9 described above will be described.

Referring to FIG. 12, in the display device 10 according to an embodiment, the first voltage wiring VDL, the second voltage wiring VSL, the initialization voltage wiring VIL, the first data wiring DTL1, the second data wiring DTL2, and the third data wiring DTL3 may be connected to the second driving circuit IC2.

In the display device 10 according to an embodiment, the first auxiliary wiring VDA and the second auxiliary wiring VSA may be arranged or disposed in the non-display area NDA adjacent to the second driving circuit IC2. The first auxiliary wiring VDA may have one end and the other end connected to the first driving circuit IC1. The first auxiliary wiring VDA may be a wiring to which the first voltage wirings VDL extending from the display area DPA are connected. The first auxiliary wiring VDA may be disposed in a shape surrounding the second auxiliary wiring VSA in the plan view. The second auxiliary wiring VSA may have one end or an end and the other end or another end connected to the first driving circuit IC1. The second auxiliary wiring VSA may be a wiring to which the second voltage wirings VSL extending from the display area DPA are connected. The first auxiliary wiring VDA and the second auxiliary wiring VSA described above may be formed as the third conductive layer and arranged or disposed to be spaced apart from each other in the plan view.

The first voltage wiring VDL may extend from the display area DPA to the non-display area NDA and be connected to the second driving circuit IC2. The first voltage wiring VDL may be formed as the first conductive layer in the display area DPA and extend to the non-display area NDA. The first voltage wiring VDL may be connected to the second driving circuit IC2 by being connected to the first auxiliary wiring VDA in the non-display area NDA.

The second voltage wiring VSL may extend from the display area DPA to the non-display area NDA and be connected to the first driving circuit IC1. The second voltage wiring VSL may be formed as the first conductive layer in the display area DPA and extend to the non-display area NDA. The second voltage wiring VSL may be connected to the second driving circuit IC2 by being jumped from the non-display area NDA to the second connection wiring VSC and connected to the second auxiliary wiring VSA.

As described above, the second voltage wiring VSL may be connected to the second auxiliary wiring VSA by being jumped to the second connection wiring VSC. For the jumping, the second connection wiring VSC may be formed as the fourth conductive layer. The second connection wiring VSC may be disposed to be coplanar with the first connection wiring VDC formed as the same fourth conductive layer. In the non-display area NDA, the second voltage wiring VSL may be connected to the second connection wiring VSC through a fifth contact hole CT5, and the second connection wiring VSC may be connected to the second auxiliary wiring VSA through a sixth contact hole CT6. Accordingly, the second voltage wiring VSL may be connected to the second auxiliary wiring VSA through the second connection wiring VSC.

The second connection wiring VSC may extend in the second direction DR2 and intersect the first auxiliary wiring VDA extending in the first direction DR1. The second connection wiring VSC and the first auxiliary wiring VDA may be arranged or disposed to overlap each other in the third direction DR3. The second connection wiring VSC may be disposed to overlap the first auxiliary wiring VDA in the third direction DR3, and the second contact hole CT2 may be disposed in the overlapped area and thus connected to the first auxiliary wiring VDA.

The first voltage wiring VDL may be connected to the first auxiliary wiring VDA in the non-display area NDA. The first voltage wiring VDL may overlap the first auxiliary wiring VDA in the non-display area NDA, and the first voltage wiring VDL and the first auxiliary wiring VDA may be connected to each other through a fourth contact hole CT4 in the overlapped area. The first auxiliary wiring VDA and the second auxiliary wiring VSA may overlap the initialization voltage wiring VIL, the first data wiring DTL1, the second data wiring DTL2, and the third data wiring DTL3 in the third direction DR3.

As described above, in the odd-numbered driving circuit, the first voltage wiring VDL may be connected to the first auxiliary wiring VDA by being jumped to the first connection wiring VDC, and in the even-numbered driving circuit, the second voltage wiring VSL may be connected to the second auxiliary wiring VSA by being jumped to the second connection wiring VSC.

Accordingly, in the driving circuits (ICn), the contact resistance of the first connection wiring VDC of the first voltage wiring VDL and the contact resistance of the second connection wiring VSC of the second voltage wiring VSL are distributed, and thus heat or a burnt circuit can be prevented from occurring in the contact holes due to the contact resistances of the wirings.

In FIGS. 8 to 12 described above, it has been described that the structures of the wirings in the odd-numbered and even-numbered driving circuit parts of the display device 10 are different from each other. However, the disclosure is not limited thereto, and the structures of the wirings in all of the driving circuit parts of the display device 10 may have a structure as in FIGS. 9 and 10 or a structure as in FIGS. 11 and 12.

Figure 13:
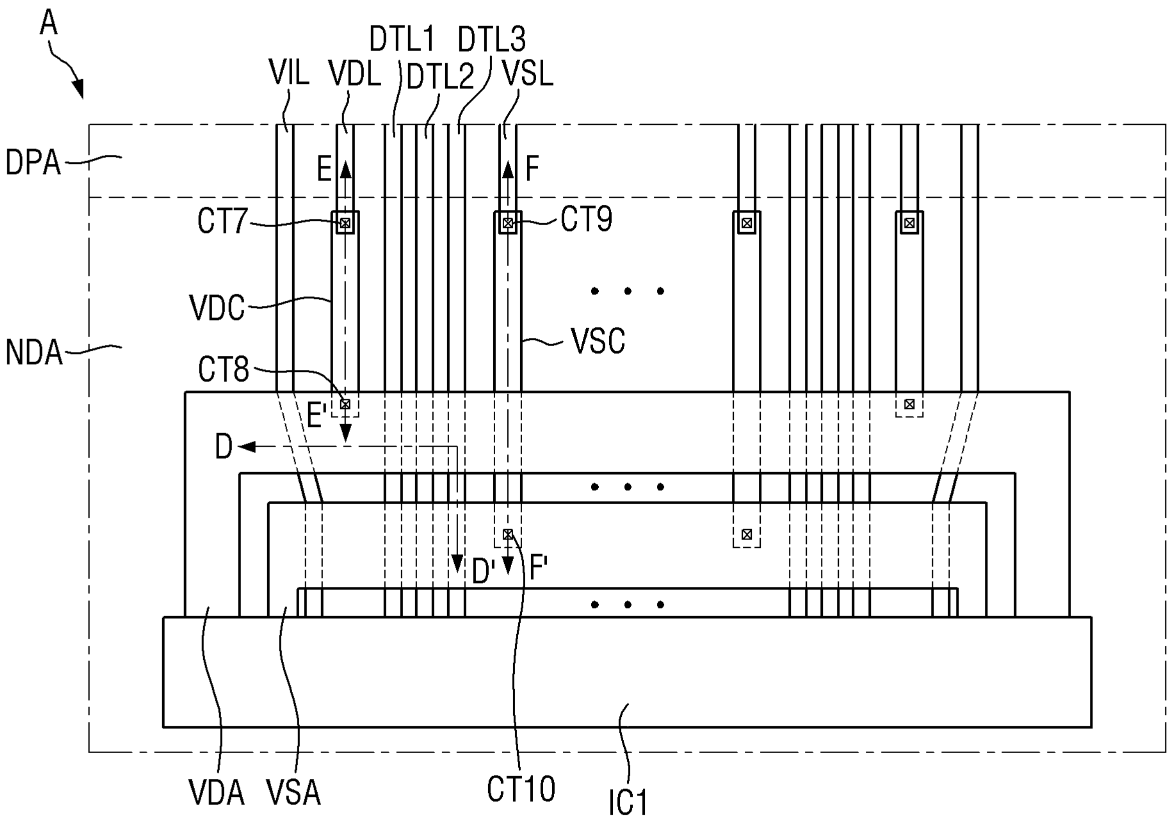
FIG. 13 is a schematic plan view illustrating a display device according to an embodiment.
Figure 14:
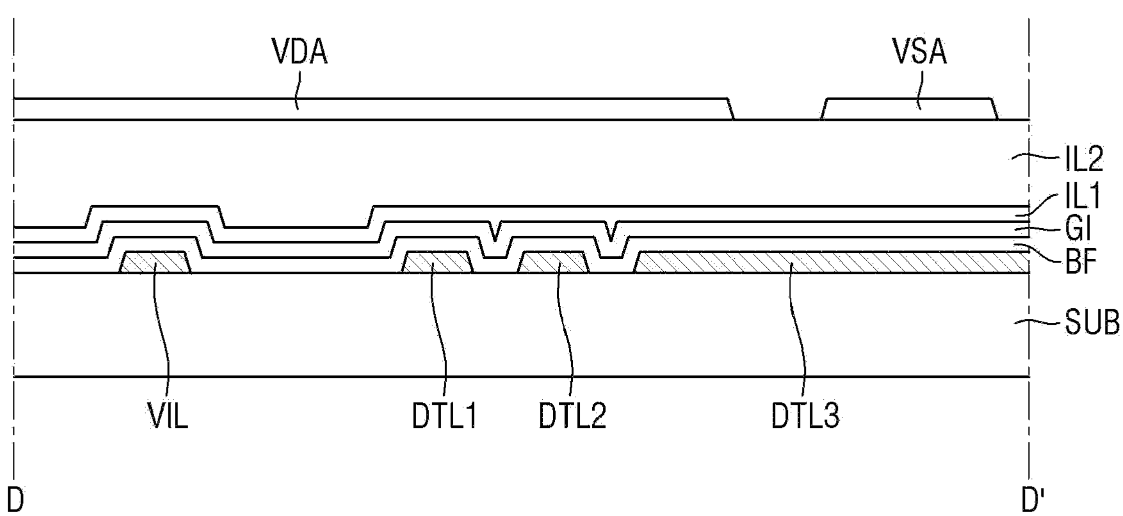
FIG. 14 is a schematic cross-sectional view taken along line D-D' of FIG. 13.
Figure 15:
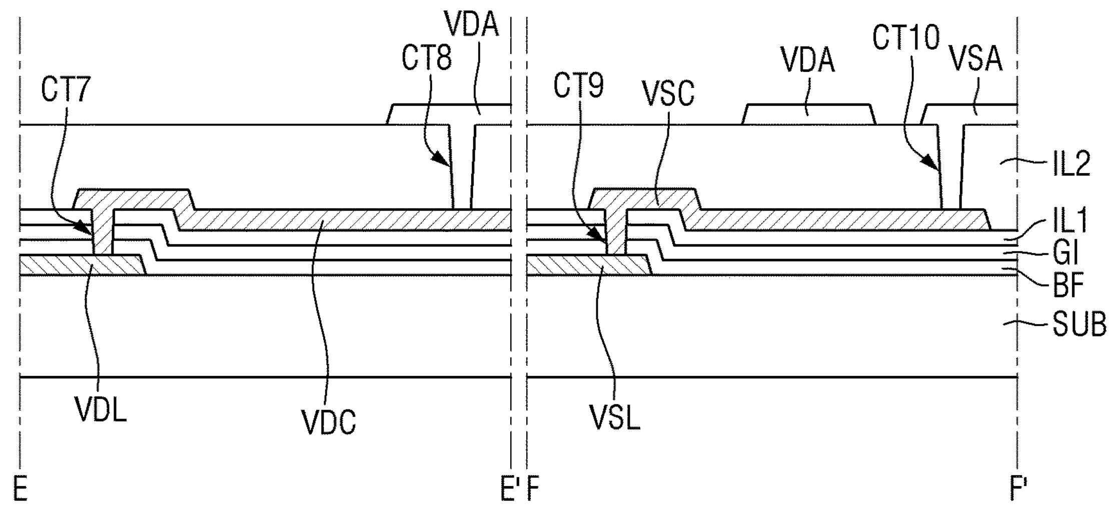
FIG. 15 is a schematic cross-sectional view taken along lines E-E' and F-F' of FIG. 13.

FIG. 13 is a schematic plan view illustrating a display device according to an embodiment. FIG. 14 is a schematic cross-sectional view taken along line D-D' of FIG. 13. FIG. 15 is a schematic cross-sectional view taken along lines E-E' and F-F' of FIG. 13. FIG. 13 is an enlarged view illustrating an area A of FIG. 8 according to an embodiment.

Referring to FIGS. 13 to 15, the display device 10 according to an embodiment may include the first voltage wiring VDL, the second voltage wiring VSL, the first auxiliary wiring VDA, the second auxiliary wiring VSA, and the first connection wiring VDC. The embodiment differs from the above-described embodiment of the FIGS. 9 to 12 in that the first auxiliary wiring VDA and the second auxiliary wiring VSA are formed as the fourth conductive layer. In the following description, different configurations will be described in detail, and the same configurations will be briefly described.

Referring to FIG. 13, in the display device 10 according to an embodiment, the first voltage wiring VDL, the second voltage wiring VSL, the initialization voltage wiring VIL, the first data wiring DTL1, the second data wiring DTL2, and the third data wiring DTL3 may be connected to each driving circuit ICn.

The first voltage wiring VDL, the second voltage wiring VSL, the initialization voltage wiring VIL, the first data wiring DTL1, the second data wiring DTL2, and the third data wiring DTL3 may be formed as the first conductive layer in the display area DPA and extend to the non-display area NDA.

In the display device 10 according to an embodiment, the first auxiliary wiring VDA and the second auxiliary wiring VSA may be formed as the fourth conductive layer and arranged or disposed to be spaced apart from each other in the plan view.

The first voltage wiring VDL may extend from the display area DPA to the non-display area NDA and be connected to the first driving circuit IC1. The first voltage wiring VDL may be formed as the first conductive layer in the display area DPA and extend to the non-display area NDA. The first voltage wiring VDL may be connected to the first driving circuit IC1 by being jumped from the non-display area NDA to the first connection wiring VDC and connected to the first auxiliary wiring VDA.

The second voltage wiring VSL may extend from the display area DPA to the non-display area NDA and be connected to the first driving circuit IC1. The second voltage wiring VSL may be formed as the first conductive layer in the display area DPA and extend to the non-display area NDA. The second voltage wiring VSL may be connected to the first driving circuit IC1 by being jumped from the non-display area NDA to the second connection wiring VSC and connected to the second auxiliary wiring VSA.

As described above, the first voltage wiring VDL may be connected to the first auxiliary wiring VDA by being jumped to the first connection wiring VDC. For the jumping, the first connection wiring VDC may be formed as the third conductive layer. In the non-display area NDA, the first voltage wiring VDL may be connected to the first connection wiring VDC through a seventh contact hole CT7, and the first connection wiring VDC may be connected to the first auxiliary wiring VDA through an eighth contact hole CT8. Accordingly, the first voltage wiring VDL may be connected to the first auxiliary wiring VDA through the first connection wiring VDC.

The second voltage wiring VSL may be connected to the second auxiliary wiring VSA by being jumped to the second connection wiring VSC. For the jumping, the second connection wiring VSC may be formed as the third conductive layer. In the non-display area NDA, the second voltage wiring VSL may be connected to the second connection wiring VSC through a ninth contact hole CT9, and the second connection wiring VSC may be connected to the second auxiliary wiring VSA through a tenth contact hole CT10. Accordingly, the second voltage wiring VSL may be connected to the second auxiliary wiring VSA through the second connection wiring VSC.

The second connection wiring VSC may extend in the second direction DR2 and intersect the first auxiliary wiring VDA extending in the first direction DR1. The second connection wiring VSC and the first auxiliary wiring VDA may be arranged or disposed to overlap each other in the third direction DR3. The second connection wiring VSC may be disposed to overlap the second auxiliary wiring VSA in the third direction DR3, and the tenth contact hole CT10 may be disposed in the overlapped area and thus connected to the second auxiliary wiring VSA.

Referring to FIGS. 14 and 15 in conjunction with FIG. 13, the first conductive layer may be disposed on the first substrate SUB. The first conductive layer may include the initialization voltage wiring VIL, the first data wiring DTL1, the second data wiring DTL2, the third data wiring DTL3, the first voltage wiring VDL, and the second voltage wiring VSL.

The buffer layer BF, the first gate insulating layer GI, and the first interlayer insulating layer IL1 may be sequentially arranged or disposed on the initialization voltage wiring VIL, the first data wiring DTL1, the second data wiring DTL2, the third data wiring DTL3, the first voltage wiring VDL, and the second voltage wiring VSL.

The first connection wiring VDC and the second connection wiring VSC may be arranged or disposed on the first interlayer insulating layer ILL The first connection wiring VDC may overlap the first voltage wiring VDL, and the second connection wiring VSC may overlap the second voltage wiring VSL. The first connection wiring VDC may be connected to the first voltage wiring VDL through the seventh contact hole CT7 passing through the buffer layer BF, the first gate insulating layer GI, and the first interlayer insulating layer IL1 and exposing the first voltage wiring VDL. The second connection wiring VSC may be connected to the second voltage wiring VSL through the ninth contact hole CT9 passing through the buffer layer BF, the first gate insulating layer GI, and the first interlayer insulating layer IL1 and exposing the second voltage wiring VSL.

The second interlayer insulating layer IL2 may be disposed on the first connection wiring VDC and the second connection wiring VSC. The first auxiliary wiring VDA may be disposed on the second interlayer insulating layer IL2. The first auxiliary wiring VDA may be disposed to overlap the initialization voltage wiring VIL, the first data wiring DTL1, the second data wiring DTL2, the third data wiring DTL3, the first connection wiring VDC, and the second connection wiring VSC. The first auxiliary wiring VDA may be connected to the first connection wiring VDC through the eighth contact hole CT8 passing through the second interlayer insulating layer IL2 and exposing the first connection wiring VDC. Further, the second auxiliary wiring VSA may be connected to the second connection wiring VSC through the tenth contact hole CT10 passing through the second interlayer insulating layer IL2 and exposing the second connection wiring VSC.

In the above-described embodiment, in the non-display area NDA, the initialization voltage wiring VIL, the first data wiring DTL1, the second data wiring DTL2, and the third data wiring DTL3 formed as the first conductive layer are formed, the first connection wiring VDC and the second connection wiring VSC formed as the third conductive layer are formed, and the first auxiliary wiring VDA and the second auxiliary wiring VSA formed as the fourth conductive layer are formed. For example, an area in which the first conductive layer and the third conductive layer overlap each other in the non-display area can be minimized, and the capacitance between the first conductive layer and the fourth conductive layer can be reduced. Further, the occurrence of a short circuit between the conductive layers stacked on the upper side can be prevented due to the step by the first conductive layer.

Figure 16:
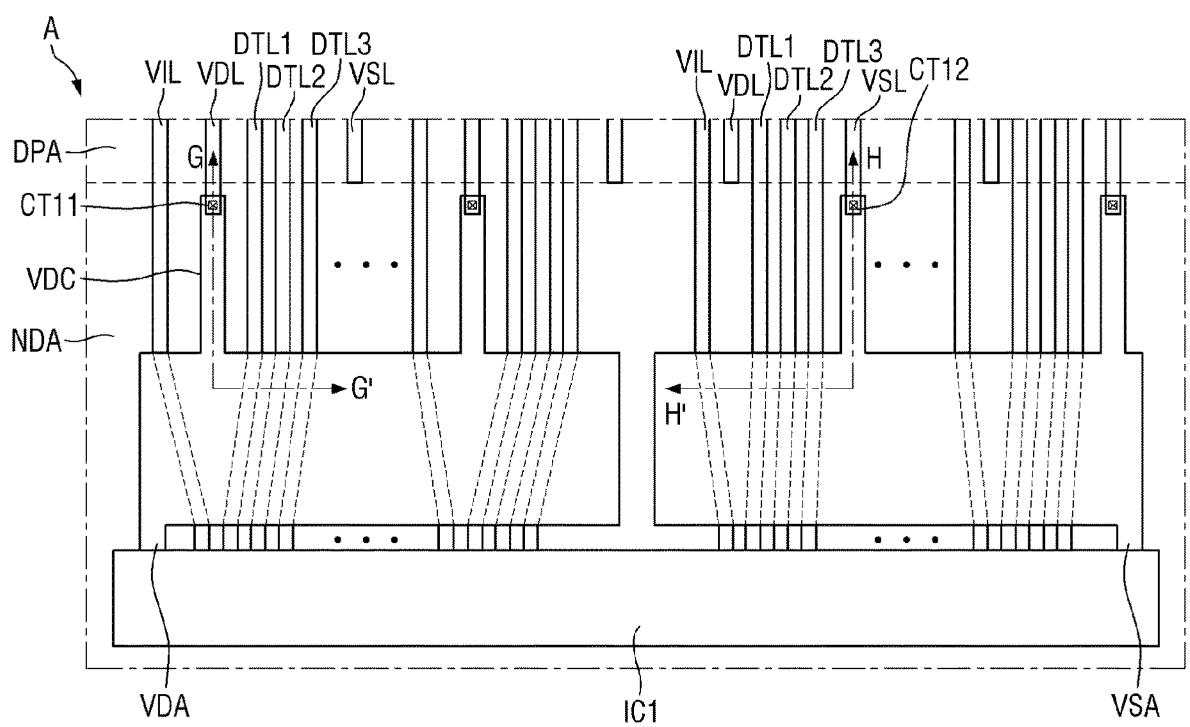
FIG. 16 is a schematic plan view illustrating a display device according to an embodiment.
Figure 17:
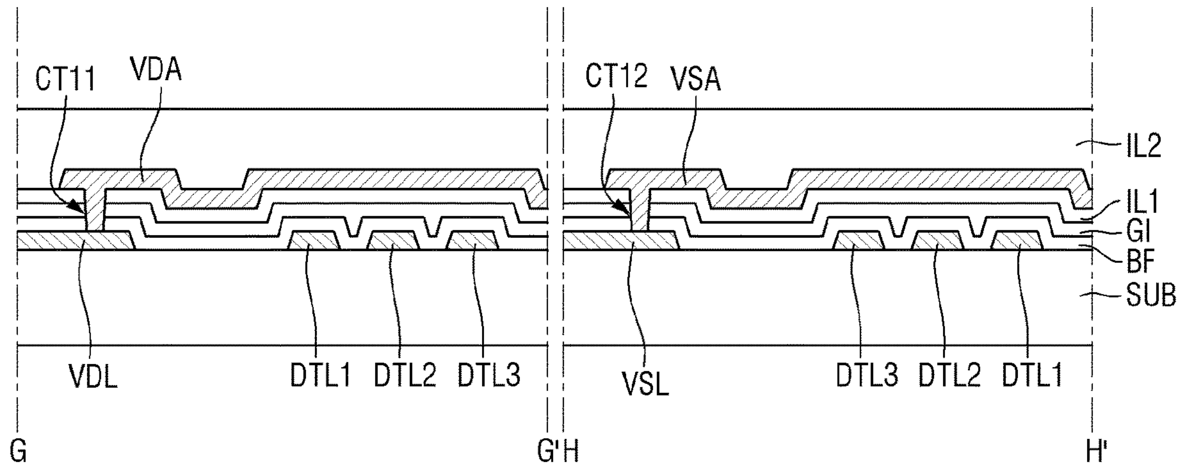
FIG. 17 is a schematic cross-sectional view taken along lines G-G' and H-H' of FIG. 16.

FIG. 16 is a schematic plan view illustrating a display device according to an embodiment. FIG. 17 is a schematic cross-sectional view taken along lines G-G' and H-H' of FIG. 16. FIG. 16 is an enlarged view illustrating an area A of FIG. 8 according to an embodiment.

Referring to FIGS. 16 to 17, the display device 10 according to an embodiment may include the first voltage wiring VDL, the second voltage wiring VSL, the first auxiliary wiring VDA, and the second auxiliary wiring VSA. The embodiment differs from the above-described embodiment of the FIGS. 9 to 15 in that the first auxiliary wiring VDA and the second auxiliary wiring VSA are formed at both ends of the driving circuit, respectively. In the following description, different configurations will be described in detail, and the same configurations will be briefly described.

Referring to FIG. 16, in the display device 10 according to an embodiment, the first auxiliary wiring VDA may be disposed on one side or a side with respect to the first driving circuit IC1 and the second auxiliary wiring VSA may be disposed on the other side or another side. For example, the first auxiliary wiring VDA may be disposed on the left side with respect to the first driving circuit IC1 and the second auxiliary wiring VSA may be disposed on the right side. The first auxiliary wiring VDA and the second auxiliary wiring VSA may not overlap each other in the second direction DR2 and may be arranged or disposed to be spaced apart from each other in the first direction DR1.

The first voltage wiring VDL overlapping the first auxiliary wiring VDA in the second direction DR2 may be connected to the first auxiliary wiring VDA in the non-display area NDA. The first voltage wiring VDL may be connected to the first auxiliary wiring VDA through a 11$^{th}$ contact hole CT11. The first voltage wiring VDL overlapping the second auxiliary wiring VSA in the second direction DR2 may not extend from the display area DPA to the non-display area NDA and may be disposed so as not to overlap the non-display area NDA. However, the first voltage wiring VDL may be connected to another first voltage wiring VDL in the display area DPA.

The second voltage wiring VSL overlapping the first auxiliary wiring VDA in the second direction DR2 may not extend from the display area DPA to the non-display area NDA and may be disposed so as not to overlap the non-display area NDA. However, the second voltage wiring VSL may be connected to other second voltage wirings VSL in the display area DPA. The second voltage wiring VSL overlapping the second auxiliary wiring VSA in the second direction DR2 may be connected to the second auxiliary wiring VSA in the non-display area NDA. The second voltage wiring VSL may be connected to the second auxiliary wiring VSA through a 12$^{th}$ contact hole CT12.

The second voltage wiring VSL overlapping the first auxiliary wiring VDA in the second direction may be connected to another second voltage wiring VSL in the display area DPA. Accordingly, a second voltage may be applied to the second voltage wiring VSL overlapping the first auxiliary wiring VDA in the second direction DR2 through the second voltage wiring VSL overlapping and connected to the second auxiliary wiring VSA in the second direction DR2. Further, the first voltage wiring VDL overlapping the second auxiliary wiring VSA in the second direction DR2 may be connected to another first voltage wiring VDL in the display area DPA. Accordingly, a first voltage may be applied to the first voltage wiring VDL overlapping the second auxiliary wiring VSA in the second direction DR2 through the first voltage wiring VDL overlapping and connected to the first auxiliary wiring VDA in the second direction DR2.

Referring to FIG. 17 in conjunction with FIG. 16, the first conductive layer may be disposed on the first substrate SUB. The first conductive layer may include the initialization voltage wiring VIL, the first data wiring DTL1, the second data wiring DTL2, the third data wiring DTL3, the first voltage wiring VDL, and the second voltage wiring VSL.

The buffer layer BF, the first gate insulating layer GI, and the first interlayer insulating layer IL1 may be sequentially arranged or disposed on the initialization voltage wiring VIL, the first data wiring DTL1, the second data wiring DTL2, the third data wiring DTL3, the first voltage wiring VDL, and the second voltage wiring VSL.

The first auxiliary wiring VDA and the second auxiliary wiring VSA may be arranged or disposed on the first interlayer insulating layer ILL In detail, the first auxiliary wiring VDA may be disposed to overlap the initialization voltage wiring VIL, the first data wiring DTL1, the second data wiring DTL2, and the third data wiring DTL3. The second auxiliary wiring VSA may be disposed to overlap the initialization voltage wiring VIL, the first data wiring DTL1, the second data wiring DTL2, and the third data wiring DTL3.

The first auxiliary wiring VDA may be connected to the first voltage wiring VDL through the 11$^{th}$ contact hole CT11 passing through the buffer layer BF, the first gate insulating layer GI, and the first interlayer insulating layer IL1 and exposing the first voltage wiring VDL. The second auxiliary wiring VSA may be connected to the second voltage wiring VSL through the 12$^{th}$ contact hole CT12 passing through the buffer layer BF, the first gate insulating layer GI, and the first interlayer insulating layer IL1 and exposing the second voltage wiring VSL.

The second interlayer insulating layer IL2 may be disposed on the first auxiliary wiring VDA and the second auxiliary wiring VSA.

In the above-described embodiment, in the non-display area NDA, the initialization voltage wiring VIL, the first data wiring DTL1, the second data wiring DTL2, and the third data wiring DTL3 formed as the first conductive layer are formed, and the first auxiliary wiring VDA and the second auxiliary wiring VSA formed as the third conductive layer are formed. For example, in the non-display area NDA, since a conductive layer is not disposed between the first conductive layer and the third conductive layer, the occurrence of a short circuit between the conductive layers stacked on the upper side can be prevented due to a step by the first conductive layer.

Figure 18:
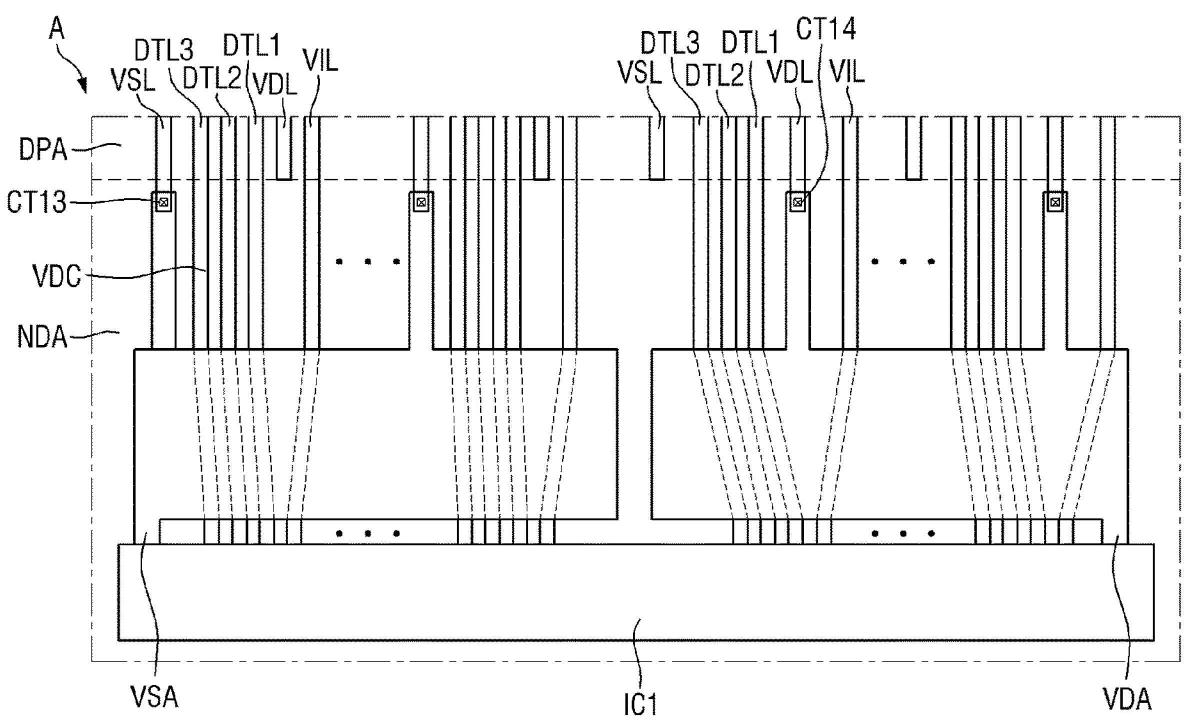
FIG. 18 is a schematic plan view illustrating a display device according to an embodiment.

FIG. 18 is a schematic plan view illustrating a display device according to yet an embodiment.

Referring to 18, the display device 10 according to an embodiment may include the first voltage wiring VDL, the second voltage wiring VSL, the first auxiliary wiring VDA, and the second auxiliary wiring VSA. The embodiment differs from the above-described embodiment of FIGS. 16 and 17 in that the arrangements of the first auxiliary wiring VDA and the second auxiliary wiring VSA are interchanged. In the following description, different configurations will be described in detail, and the same configurations will be briefly described.

Referring to FIG. 18, in the display device 10 according to an embodiment, the second auxiliary wiring VSA may be disposed on one side or a side with respect to the first driving circuit IC1 and the first auxiliary wiring VDA may be disposed on the other side or another side. For example, the second auxiliary wiring VSA may be disposed on the left side with respect to the first driving circuit IC1, and the first auxiliary wiring VDA may be disposed on the right side. The first auxiliary wiring VDA and the second auxiliary wiring VSA may not overlap each other in the second direction DR2 and may be arranged or disposed to be spaced apart from each other in the first direction DR1.

The second voltage wiring VSL overlapping the second auxiliary wiring VSA in the second direction DR2 may be connected to the second auxiliary wiring VSA in the non-display area NDA. The second voltage wiring VSL may be connected to the second auxiliary wiring VSA through a $13^{th}$ contact hole CT13. The first voltage wiring VDL overlapping the second auxiliary wiring VSA in the second direction DR2 may not extend from the display area DPA to the non-display area NDA and may be disposed so as not to overlap the non-display area NDA. However, the first voltage wiring VDL may be connected to another first voltage wiring VDL in the display area DPA.

The first voltage wiring VDL overlapping the first auxiliary wiring VDA in the second direction DR2 may be connected to the first auxiliary wiring VDA in the non-display area NDA. The first voltage wiring VDL may be connected to the first auxiliary wiring VDA through a $14^{th}$ contact hole CT14. The second voltage wiring VSL overlapping the first auxiliary wiring VDA in the second direction DR2 may not extend from the display area DPA to the non-display area NDA and may be disposed so as not to overlap the non-display area NDA. However, the second voltage wiring VSL may be connected to other second voltage wirings VSL in the display area DPA.

The second voltage wiring VSL overlapping the first auxiliary wiring VDA in the second direction may be connected to another second voltage wiring VSL in the display area DPA. Accordingly, a second voltage may be applied to the second voltage wiring VSL overlapping the first auxiliary wiring VDA in the second direction DR2 through the second voltage wiring VSL overlapping and connected to the second auxiliary wiring VSA in the second direction DR2. Further, the first voltage wiring VSL overlapping the second auxiliary wiring VSA in the second direction DR2 may be connected to another first voltage wiring VDL in the display area DPA. Accordingly, the first voltage may be applied to the first voltage wiring VDL overlapping the second auxiliary wiring VSA in the second direction DR2 through the first voltage wiring VDL that is overlapping and connected to the first auxiliary wiring VDA in the second direction DR2.

In the above-described embodiment, in the non-display area NDA, the initialization voltage wiring VIL, the first data wiring DTL1, the second data wiring DTL2, and the third data wiring DTL3 formed as the first conductive layer are formed, and the first auxiliary wiring VDA and the second auxiliary wiring VSA formed as the third conductive layer are formed. For example, in the non-display area NDA, since a conductive layer is not disposed between the first conductive layer and the third conductive layer, the occurrence of a short circuit between the conductive layers stacked on the upper side can be prevented due to a step by the first conductive layer.

According to a display device according to embodiments, in an odd-numbered driving circuit, a first voltage wiring can be connected to a first auxiliary wiring by being jumped to a first connection wiring, and in an even-numbered driving circuit, a second voltage wiring can be connected to a second auxiliary wiring by being jumped to a second connection wiring. Accordingly, in the driving circuits, by dispersing the contact resistance of the first voltage wiring and the first connection wiring and the contact resistance of the second voltage wiring and the second connection wiring, heat or a burnt circuit can be prevented from occurring in contact holes due to the contact resistances of the wirings.

Further, according to the display device according to embodiments, by securing a gap between the wirings formed as a first conductive layer and the wirings formed as a third conductive layer in a non-display area, short defects of the wirings formed as the third conductive layer can be prevented due to a step between the wirings formed as the first conductive layer.

Effects according to embodiments are not limited by the contents illustrated above, and more various effects are included in the specification.

Hereinabove, embodiments of the disclosure have been described with reference to the accompanying drawings. However, those skilled in the art to which the disclosure pertains can understand that other forms can be implemented without changing the technical spirit or essential features of the disclosure. Therefore, it should be understood that embodiments described above are illustrative but not limiting in all aspects.

What is claimed is:

1. A display device comprising:

a substrate including a display area and a non-display area;

driving circuits disposed in the non-display area;

first voltage wirings and second voltage wirings extending from the display area to the non-display area;

a first auxiliary wiring electrically connected to the first voltage wirings and a second auxiliary wiring electrically connected to the second voltage wirings, the first auxiliary wiring and the second auxiliary wiring being electrically connected to the driving circuits, wherein the first voltage wirings electrically connected to an odd-numbered driving circuit among the driving circuits are electrically connected to the first auxiliary wiring through a first connection wiring, and the second voltage wirings electrically connected to an even-numbered driving circuit among the driving circuits are electrically connected to the second auxiliary wiring through a second connection wiring.

2. The display device of claim 1, wherein the second voltage wirings electrically connected to the odd-numbered driving circuit among the driving circuits are directly connected to the second auxiliary wiring, and the first voltage wirings electrically connected to the even-numbered driving circuit among the driving circuits are directly connected to the first auxiliary wiring.

3. The display device of claim 2, wherein the first voltage wirings and the second voltage wirings are coplanar, and the first auxiliary wiring and the second auxiliary wiring are coplanar.

4. The display device of claim 3, wherein the first auxiliary wiring and the second auxiliary wiring are disposed on the first voltage wirings and the second voltage wirings.

5. The display device of claim 4, further comprising:

a buffer layer, a first gate insulating layer, and a first interlayer insulating layer disposed on the first voltage wirings and the second voltage wirings, wherein the first auxiliary wiring and the second auxiliary wiring are disposed on the first interlayer insulating layer.

6. The display device of claim 4, wherein the first connection wiring and the second connection wiring are disposed on the first auxiliary wiring and the second auxiliary wiring.

7. The display device of claim 6, wherein the first connection wiring and the second connection wiring are coplanar.

8. The display device of claim 6, further comprising:

a second interlayer insulating layer disposed on the first auxiliary wiring and the second auxiliary wiring, wherein the first connection wiring and the second connection wiring are disposed on the second interlayer insulating layer.

9. The display device of claim 2, wherein the second auxiliary wiring electrically connected to the odd-numbered driving circuit surrounds the first auxiliary wiring, and the first connection wiring overlaps the second auxiliary wiring.

10. The display device of claim 9, wherein the first auxiliary wiring electrically connected to the even-numbered driving circuit surrounds the second auxiliary wiring, and the second connection wiring overlaps the first auxiliary wiring.

11. A display device comprising:

a substrate including a display area and a non-display area;

a driving circuit disposed in the non-display area;

a first voltage wiring and a second voltage wiring extending from the display area to the non-display area;

a first auxiliary wiring electrically connected to the first voltage wiring and a second auxiliary wiring electrically connected to the second voltage wiring, the first auxiliary wiring and the second auxiliary wiring being electrically connected to the driving circuit;

a first connection wiring electrically connecting the first voltage wiring and the first auxiliary wiring; and a second connection wiring electrically connecting the second voltage wiring and the second auxiliary wiring, wherein the first connection wiring and the second connection wiring are disposed on the first voltage wiring and the second voltage wiring, and the first auxiliary wiring and the second auxiliary wiring are disposed on the first connection wiring and the second connection wiring.

12. The display device of claim 11, further comprising:

a buffer layer, a first gate insulating layer, and a first interlayer insulating layer disposed on the first voltage wiring and the second voltage wiring, wherein the first connection wiring and the second connection wiring are disposed on the first interlayer insulating layer.

13. The display device of claim 12, further comprising:

a second interlayer insulating layer disposed on the first connection wiring and the second connection wiring, wherein the first auxiliary wiring and the second auxiliary wiring are disposed on the second interlayer insulating layer.

14. The display device of claim 11, further comprising:

an initialization voltage wiring, a first data wiring, a second data wiring, and a third data wiring extending from the display area to the non-display area and electrically connected to the driving circuit.

15. The display device of claim 14, wherein the initialization voltage wiring, the first data wiring, the second data wiring, and the third data wiring are coplanar with the first voltage wiring and the second voltage wiring.

16. The display device of claim 14, wherein the first auxiliary wiring and the second auxiliary wiring overlap the initialization voltage wiring, the first data wiring, the second data wiring, and the third data wiring.

17. The display device of claim 14, wherein the second connection wiring overlaps the first auxiliary wiring and the second auxiliary wiring, and the first connection wiring overlaps the first auxiliary wiring and does not overlap the second auxiliary wiring.

18. The display device of claim 14, wherein the first auxiliary wiring surrounds the second auxiliary wiring and is closer to the display area than the second auxiliary wiring.

19. The display device of claim 11, wherein the display area includes pixels, and each of the pixels includes:

- a first electrode and a second electrode extending in a direction and spaced apart from each other;
- a light emitting element having ends disposed on the first electrode and the second electrode;
- a first contact electrode electrically connected to an end of the light emitting element; and
- a second contact electrode electrically connected to another end of the light emitting element.

20. The display device of claim 19, wherein the light emitting element includes:

a first semiconductor layer;

a second semiconductor layer disposed on the first semiconductor layer; and a light emitting layer disposed between the first semiconductor layer and the second semiconductor layer, and the light emitting layer includes an insulating film surrounding the first semiconductor layer, the second semiconductor layer, and the light emitting layer.

* * * * *